(12) United States Patent
Chung et al.

(10) Patent No.: US 8,559,255 B2
(45) Date of Patent: *Oct. 15, 2013

(54) CONTROLLING AC DISTURBANCE WHILE PROGRAMMING

(75) Inventors: Sung-Yong Chung, Santa Clara, CA (US); Zhizheng Liu, San Jose, CA (US); Yugi Mizuguchi, Santa Clara, CA (US); Xuguang Alan Wang, Eden Prairie, MN (US); Yi He, Fremont, CA (US); Ming Kwan, San Leandro, CA (US); Darlene Hamilton, Lyle, WA (US); Sung-Chul Lee, Cupertino, CA (US); Guowei Wang, San Jose, CA (US); Nancy Leong, Cupertino, CA (US)

(73) Assignee: Spansion LLC, Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/569,442

(22) Filed: Aug. 8, 2012

(65) Prior Publication Data

US 2012/0294103 A1    Nov. 22, 2012

Related U.S. Application Data

(60) Continuation of application No. 13/156,763, filed on Jun. 9, 2011, now Pat. No. 8,264,898, and a division of application No. 12/650,118, filed on Dec. 30, 2009, now Pat. No. 7,986,562, and a division of application No. 11/963,508, filed on Dec. 21, 2007, now Pat. No. 7,679,967.

(51) Int. Cl.
   *G11C 7/00* (2006.01)

(52) U.S. Cl.
   USPC ............... 365/203; 365/185.25; 365/185.02

(58) Field of Classification Search
   USPC .............................. 365/203, 185.25, 185.02
   See application file for complete search history.

(56) References Cited

U.S. PATENT DOCUMENTS

| | | |
|---|---|---|
| 5,062,079 A | 10/1991 | Tsuchida et al. |
| 5,134,588 A | 7/1992 | Kubota et al. |
| 5,754,469 A | 5/1998 | Hung et al. |
| 5,936,898 A | 8/1999 | Chi |
| 6,005,802 A | 12/1999 | Takeuchi et al. |
| 6,028,788 A | 2/2000 | Choi et al. |

(Continued)

OTHER PUBLICATIONS

International Search Report & Written Opinion dated Apr. 1, 2009 for PCT/US2008/087829.

(Continued)

*Primary Examiner* — Viet Q Nguyen
(74) *Attorney, Agent, or Firm* — Turocy & Watson, LLP

(57) ABSTRACT

A system and methodology that can minimize disturbance during an AC operation associated with a memory, such as, program, read and/or erase, is provided. The system pre-charges all or a desired subset of the bit lines in a memory array to a specified voltage, during an AC operation to facilitate reducing AC disturbances between neighboring cells. A pre-charge voltage can be applied to all bit lines in a block in the memory array, or to bit lines associated with a selected memory cell and neighbor memory cells adjacent to the selected memory cell in the block. The system ensures that source and drain voltage levels can be set to desired levels at the same or substantially the same time, while selecting a memory cell. This can facilitate minimizing AC disturbances in the selected memory cell during the AC operation.

20 Claims, 17 Drawing Sheets

(56) References Cited

U.S. PATENT DOCUMENTS

| | | | |
|---|---|---|---|
| 3,061,270 | A | 5/2000 | Choi et al. |
| 6,191,988 | B1 | 2/2001 | DeBrosse |
| 6,442,087 | B1 | 8/2002 | Morishima |
| 6,469,955 | B1 | 10/2002 | Tsao et al. |
| 6,525,969 | B1 | 2/2003 | Kurihara et al. |
| 6,574,135 | B1 | 6/2003 | Komatsuzaki |
| 6,639,842 | B1 | 10/2003 | Hoang et al. |
| 6,661,707 | B2 | 12/2003 | Choi et al. |
| 6,683,805 | B2 | 1/2004 | Joshi et al. |
| 6,731,542 | B1 | 5/2004 | Le et al. |
| 6,768,679 | B1 | 7/2004 | Le et al. |
| 6,788,583 | B2 | 9/2004 | He et al. |
| 6,795,357 | B1 | 9/2004 | Liu et al. |
| 6,839,276 | B2 | 1/2005 | Sugiura et al. |
| 6,950,330 | B2 | 9/2005 | Thompson et al. |
| 7,184,317 | B2 | 2/2007 | Roehr |
| 7,272,060 | B1 | 9/2007 | Lu et al. |
| 7,289,376 | B2 | 10/2007 | Chang et al. |
| 7,329,556 | B2 | 2/2008 | Kim |
| 7,339,846 | B2 | 3/2008 | Lin et al. |
| 7,668,011 | B2 | 2/2010 | Kye et al. |
| 7,672,166 | B2 | 3/2010 | Park et al. |
| 7,679,967 | B2 * | 3/2010 | Chung et al. ............. 365/185.25 |
| 7,751,249 | B2 | 7/2010 | Lee et al. |
| 7,986,562 | B2 * | 7/2011 | Chung et al. ............. 365/185.25 |
| 8,264,898 | B2 * | 9/2012 | Chung et al. ................. 365/203 |
| 2004/0042324 | A1 | 3/2004 | You |
| 2007/0133302 | A1 | 6/2007 | Oda |

OTHER PUBLICATIONS

U.S. Office Action dated Nov. 20, 2009 corresponding to U.S. Appl. No. 11/963,508, filed Dec. 21, 2001.

U.S. Office Action dated Dec. 15, 2011 corresponding to U.S. Appl. No. 13/156,763, filed Jun. 9, 2011.

\* cited by examiner

CONTROLLING AC DISTURBANCE WHILE PROGRAMMING

CROSS-REFERENCE TO RELATED APPLICATIONS

This application is a Continuation of U.S. patent application Ser. No. 13/156,763 filed Jun. 9, 2011, which is a Division of U.S. patent application Ser. No. 12/650,118 filed Dec. 30, 2009, which is a Division of U.S. patent application Ser. No. 11/963,508, filed Dec. 21, 2007, all of which are incorporated herein by reference.

TECHNICAL FIELD

The subject innovation relates generally to memory systems and in particular, to systems and/or methodologies that can minimize disturbance during an AC operation, such as, programming.

BACKGROUND

One area of recent advancement is the development of different memory types, each with different characteristics. An important aspect of a majority of electronic devices is the ability to store information in digital memory, which stores information as a series of I/Os. Digital memory is a broad category with many different types of subset memory. In particular, flash memory is a type of electronic memory media that can be rewritten and that can retain content without consumption of power. Unlike dynamic random access memory (DRAM) devices and static random memory (SRAM) devices in which a single byte can be erased, flash memory devices are typically erased in fixed multi-bit blocks or sectors. Flash memory technology can include NOR flash memory and NAND flash memory, for example. NOR flash memory evolved from electrically erasable read only memory (EEPROM) chip technology, in which, unlike flash memory, a single byte can be erased; and NAND flash memory evolved from DRAM technology. Flash memory devices typically are less expensive and denser as compared to many other memory devices, meaning that flash memory devices can store more data per unit area.

In addition to being readable, re-writable (e.g., erased and written to again), and non-volatile, flash memory is relatively cheap to mass-produce. The economic factor makes flash memory much more appropriate for personal applications, such as storing of digital photographs and storing digital music files. Flash memory devices generally have a life span of about one million programming cycles. Flash memory can be used in many portable electronic products, such as cell phones, portable computers, voice recorders, thumbnail drives and the like, as well as in many larger electronic systems, such as cars, planes, industrial control systems, etc.

In conventional flash memory, disturbances can occur during the programming and/or read and/or erase operation. Typically, these disturbances are due to electron injection during the operation and can cause errors in programming, reading or erasing. Furthermore, disturbances also can be experienced by memory cells neighboring a selected memory cell during an AC (alternating current) operation, such as, programming, reading and/or erasing. This can cause current to flow through a neighboring cell, which could reprogram the neighboring cell and result in incorrect data.

SUMMARY

The following presents a simplified summary of the specification in order to provide a basic understanding of some aspects of the specification. This summary is not an extensive overview of the specification. It is intended to neither identify key or critical elements of the specification nor delineate the scope of the specification. Its sole purpose is to present some concepts of the specification in a simplified form as a prelude to the more detailed description that is presented later.

The system disclosed and claimed herein, in one aspect thereof, facilitates minimization of alternating current (AC) disturbances that can occur in memory devices. AC disturbances can occur within a cell due to electron injection as well as in neighboring cells due to a channel effect. The disclosed system can facilitate reducing these disturbances by employing an AC disturbance control component associated with a memory array in the memory.

In accordance with another aspect of the system, a pre-charge component can be employed to control bit lines of a memory array during an AC operation. All bit lines of the memory array, including those of the selected memory cell, can be pre-charged to a voltage Vcc, which can be externally supplied. By pre-charging all the bit-lines, the voltage difference between bit lines of the selected cell and the neighboring cell can be reduced and thus false programming of a neighboring cell can be minimized and/or avoided.

Another aspect of the subject specification describes a timer component that can ensure the voltages at the drain and source can be set at the same or substantially the same time. Furthermore, a sequence for change in voltages can be specified for an AC operation, such as a program operation. The system can ensure that the sequence of voltage changes can be maintained. Based in part on the sequence and bias level, AC disturbances can be reduced.

Yet another aspect of the claimed subject matter relates to a method that can minimize disturbances during an AC operation associated with data by pre-charging bit lines to a specific level and ensuring the source and drain voltages change to a desired voltage at the same or substantially the same time. Furthermore, the data can be secure data and/or a user can initiate an AC operation to be performed via a user interface.

The following description and the annexed drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

DETAILED DESCRIPTION

Figure 1:
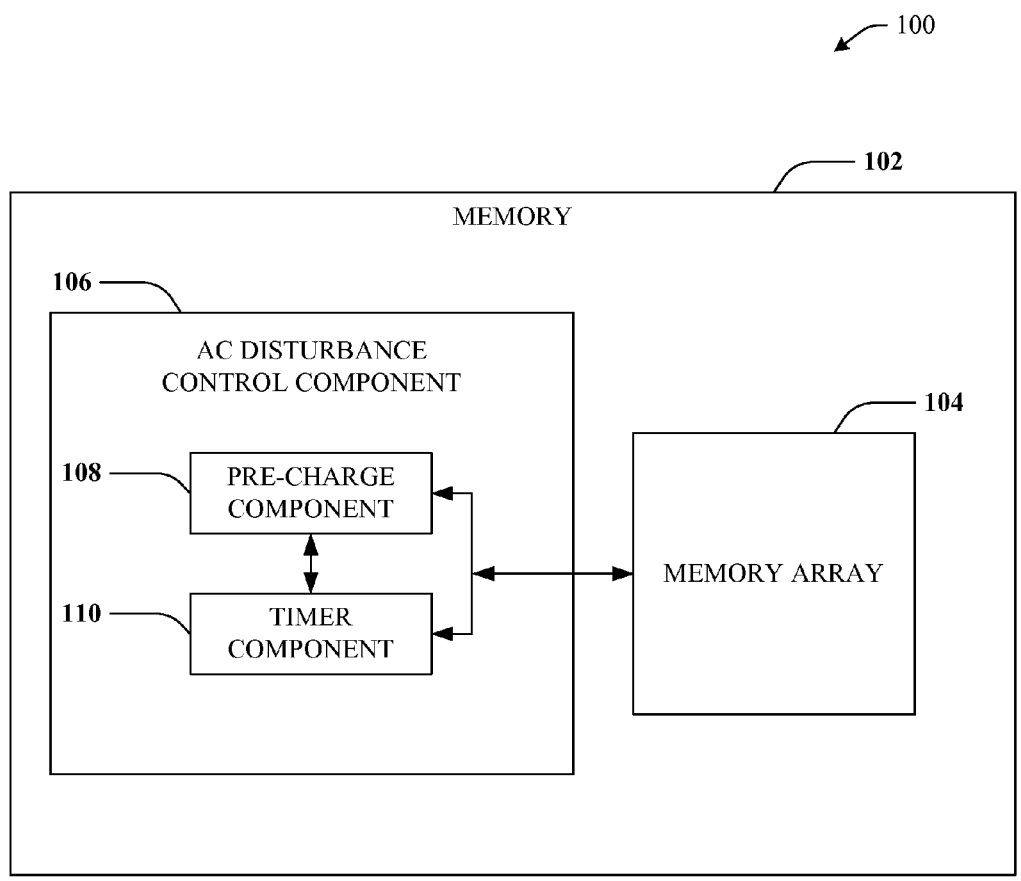
FIG. 1 illustrates an example system that can reduce disturbances during AC operations in a memory cell in a memory, according to an aspect of the subject specification.

The disclosed subject matter is now described with reference to the drawings, wherein like reference numerals are used to refer to like elements throughout. In the following description, for purposes of explanation, numerous specific details are set forth in order to provide a thorough understanding of the disclosed subject matter. It may be evident, however, that the disclosed subject matter can be practiced without these specific details. In other instances, well-known structures and devices are shown in block diagram form in order to facilitate describing the disclosed subject matter.

As used in this application, the terms "component," "module," "system", "interface", or the like are generally intended to refer to a computer-related entity, either hardware, a combination of hardware and software, software, or software in execution. For example, a component may be, but is not limited to being, a process running on a processor, a processor, an object, an executable, a thread of execution, a program, and/or a computer. By way of illustration, both an application running on a controller and the controller can be a component. One or more components may reside within a process and/or thread of execution and a component may be localized on one computer and/or distributed between two or more computers. As another example, an interface can include I/O components as well as associated processor, application, and/or API components.

Furthermore, the disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, carrier, or media. For example, computer readable media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Additionally it should be appreciated that a carrier wave can be employed to carry computer-readable electronic data such as those used in transmitting and receiving electronic mail or in accessing a network such as the Internet or a local area network (LAN). Of course, those skilled in the art will recognize many modifications may be made to this configuration without departing from the scope or spirit of the claimed subject matter.

As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Typically, conventional systems can perform operations such as read, program and/or erase on a selected memory cell in a memory. However, during the operation a disturbance can occur since voltage at the terminals of the selected cell is not changed at substantially the same time. Furthermore, charge can leak into the neighboring cells due to a channel effect. In particular, if the bit lines of the neighboring cells are at ground voltage, a current can flow from the charged terminals of the selected cell into the neighboring cell. This can lead to false programming of the neighboring cell.

Systems and/or methods are presented that can reduce disturbances in memory, during an operation, such as, program, read and/or erase. The memory can include an AC disturbance control component that can be employed to change voltages at terminals of a selected cell at substantially the same time. Furthermore, the AC disturbance control component can be employed to pre-charge all bit-lines in the memory during an AC operation. Bit lines neighboring the selected cell are pre charged to a specified voltage and the voltage difference between the terminals of the selected cell and the neighboring cell is reduced during the AC operation. Thus, current flowing through the neighboring cell is minimized and disturbance is reduced.

Referring initially to FIG. 1, illustrated is a system 100 that can facilitate a reduction in disturbance during an AC operation associated with a memory 102 in accordance with an aspect of the disclosed subject matter. The memory 102 can be a non-volatile memory, such as a flash memory device (e.g., single-bit flash memory, multi-bit flash memory). The memory 102 can be comprised of NAND memory and/or NOR memory. The memory 102 can include a memory array 104 that can receive and store data. The memory array 104 can include a plurality of memory cells (not shown) wherein each memory cell can store one or more bits of data. Data stored in a memory cell(s) in the memory array 104 can also be read and such data can be provided as an output.

Various AC operations can be performed on each memory cell, for example, programming, reading and/or erasing. During programming, it is desirable to have AC control over terminals (e.g. source, drain, or gate) of a transistor that is being programmed. If there is insufficient AC control, a disturbance can occur during an operation due to electron injection and can result in false reading and/or false programming.

A single memory cell can be programmed by employing most any electron injection technique, such as, for example, Channel Hot electron Injection (CHI). Conventionally, when voltages associated with CHI are applied at the terminals of the transistor in the cell, a large channel current can flow under the gate. When electrons reach the end of the channel, they can become hot and energetic and can be injected into the dielectric. This can lead to false programming of the memory cell and can cause errors if injection occurs in unselected cells.

Furthermore, disturbances can be caused due to flow of current between neighboring cells in a memory array during AC operations. Generally, when bit lines are selected, a voltage can be applied to them. The neighboring bit line, which is not selected, is typically floating and its potential is initially close to ground and thus a current can flow between the selected and unselected bit lines, which can result in errors.

Referring back to FIG. 1, system 100 can be employed to minimize the aforementioned disturbances during AC operations in a memory cell in a memory 102. The system 100 can include an AC disturbance control component 106 that can reduce the AC disturbances in a memory array 104. In accordance with one aspect, the AC disturbance control component 106 can include a pre-charge component 108 and a timer component 110.

In accordance with an aspect, the pre-charge component 108 can be employed to pre-charge bit lines in the memory array 104 to a specific predetermined voltage level, during an AC operation associated with a memory cell(s) in the memory 102 to facilitate reducing AC disturbances in the memory cell and/or in neighboring memory cells in the memory array 104. As an example, during programming of a memory cell, the bit line associated the memory cell as well as all bit lines (selected or unselected) associated with neighboring memory cells (e.g., all bit lines of memory cells in a block in the memory; or bit lines that are associated with neighbor memory cells that are adjacent to the memory cell in the block) can be pre-charged to a predetermined voltage level, such as Vcc (e.g. 1.5V). On selection of a memory cell, the voltage on the bit lines of that cell can be changed. However, since the neighboring bit lines are pre-charged to the same predetermined voltage level, the current flowing between the bit lines can be at a minimum and thus disturbance of the memory cells can be reduced.

The timer component 110 can be employed to ensure that the rise and/or fall times of voltage levels in the terminals of the memory cell are substantially the same. Specifically, the timer component 110 can change the voltage at the source and drain of the selected memory cell, during most any AC operation associated with the memory cell, such that, the source and drain voltages reach the desired voltage levels at substantially the same time. Typically, voltages at different terminals cannot rise high at same time, because of varying capacitances and resistances along each of the terminals. However, a correct timing sequence of voltage changes can be maintained by the timer component 110 to compensate the effect of the capacitances and/or resistances.

As an example, during a program operation, the memory cell to be programmed can be selected. The address of the selected memory cell can be obtained from an address bus. The AC disturbance control component 106 can determine that an AC operation is being performed. At the beginning of the operation, the pre-charge component 108 can pre-charge all bit lines in the memory array 104 to a specified voltage. The timer component 110 can facilitate changing the voltage at the source and drain terminals of the selected memory cell to a desired voltage at the same or substantially the same time.

The selected memory cell can be programmed and after programming the memory cell, the timer component 110 can change the source and drain voltage back to the pre-charge voltage, at the same or substantially the same time. The pre-charge component 108 can determine the end of the program operation and discharge the pre-charged bit lines to ground potential.

Turning back the memory component(s) 102, the memory component(s) 102 can comprise nonvolatile memory and/or volatile memory. The nonvolatile memory can include, for example, flash memory (e.g., single-bit flash memory, multi-bit flash memory), mask-programmed ROM, programmable ROM (PROM), Erasable PROM (EPROM), Ultra Violet (UV)-erase EPROM, one-time programmable ROM, electrically erasable PROM (EEPROM, and/or nonvolatile RAM (e.g., ferroelectric RAM (FeRAM)). The volatile memory can include, for example, RAM, static RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and/or Rambus dynamic RAM (RDRAM).

Figure 2:
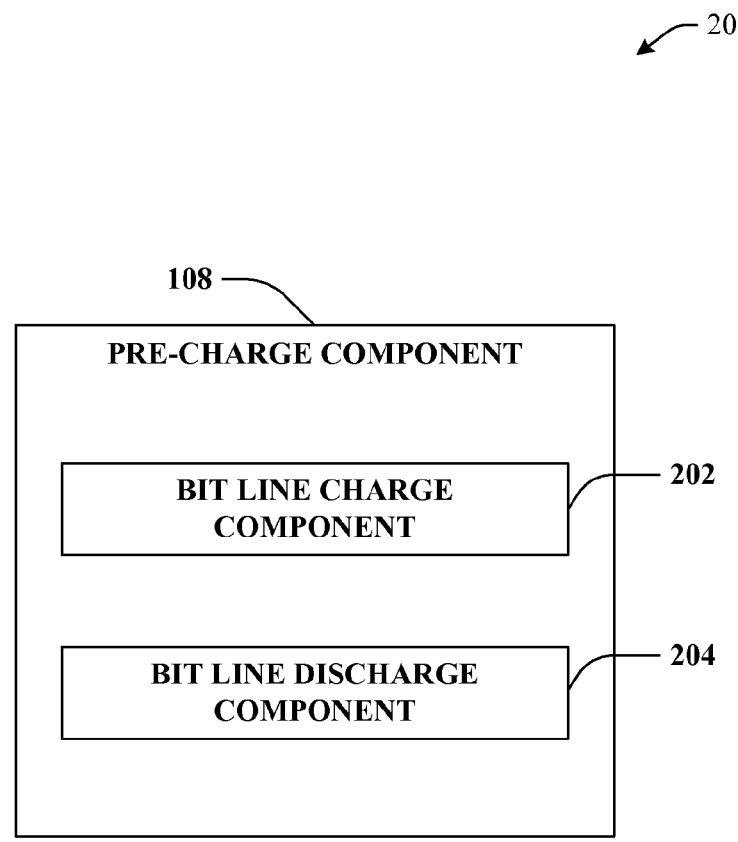
FIG. 2 illustrates an example system that can reduce errors while performing AC operations in a memory cell in a memory in accordance with an aspect of the disclosed subject matter.

Referring now to FIG. 2, illustrated is a system 200 that can facilitate a reduction in disturbance during performance of an operation(s) associated with a memory in accordance with an aspect of the disclosed subject matter. System 200 can comprise a pre-charge component 108 that can facilitate reducing disturbance (e.g., AC disturbance) associated with a memory cell(s) during operations (e.g., program, read, erase) performed on a memory cell. In accordance with one aspect, the pre-charge component 108 can control the voltage level of all bit lines in a memory array (not shown). The pre-charge component 108 can typically include a bit line charge component 202. Typically, the bit line charge component 202 can monitor the system to determine when an AC operation is performed on a memory cell in the memory array. The AC operation can include, but is not limited to, a program operation, a read operation and/or an erase operation.

The bit line charge component 202 can determine when an AC operation is being performed and pre-charge every bit line in the memory array to a specified voltage. The specified voltage can be user-specified or pre-defined and can be provided by an external supply voltage and/or derived from an internal circuit.

As an example, during a program operation associated with a memory cell in a block in a memory array, the bit line charge component 202 can pre-charge all or a portion of the bit lines in the block (e.g., all bit lines in the block; bit lines of the memory cells and neighbor memory cells adjacent thereto) to a pre-charge voltage, Vcc (e.g. 1.5 V). The voltage at the source and drain terminals of the memory cell can be changed to desired voltage (e.g. Vs=0.5V, Vd=4V) and the memory cell can be pulsed as part of the programming of the selected memory cell. During programming of a selected memory cell, the unselected bit lines can float, where the respective voltage levels of unselected bit lines adjacent or close to the source bit line, which is at Vs, can decay from the Vcc level, since Vs is lower than Vcc; and the respective voltage levels of unselected bit lines adjacent or close to the drain bit line, which can be at Vd, can rise from the Vcc level, since Vd is greater than Vcc. Thus, the voltage difference between the terminals of the selected memory cell and the neighboring unselected cells can be reduced (e.g. Vd-Vcc, and/or Vcc-Vs) and a minimal current can flow through the neighboring unselected memory cells. It can be appreciated that bit line charge component 202 can employ most any voltage charging circuit to discharge the bit lines to ground potential after programming is complete.

Typically, an AC operation can include a series of pulses to perform an operation, for example, program of a memory cell. A pulse can be defined as an event of change in Vd and Vs to a desired voltage level from the pre-charge level of Vcc. During pulsing, all unselected bit lines can float from their pre-charged level. The AC operation can be completed after the series of pulses have ended.

The pre-charge component 108 can further include a bit line discharge component 204 that can be employed to minimize disturbances during AC operations performed in a memory array. The bit line discharge component 204 can determine when an AC operation in a memory cell of the memory array has ended. Further, the bit line discharge component 204 can discharge all the bit lines in the memory array, including the source and drain of the selected memory cell to ground.

Continuing with the above example, the bit line discharge component 204 can determine when Vs and Vd are changed back to the pre-charge voltage, Vcc, from the desired programming voltages of Vs and Vd. This can indicate that the memory cell has been programmed and the operation on the selected cell has been completed. The bit line discharge component 204 can determine if another operation is to be performed on any memory cell in the memory array. If all operations have been completed, the bit line discharge component 204 can discharge all bit lines in the memory array, which are currently pre-charged to Vcc, to zero volts. It can be appreciated that bit line discharge component 204 can employ most any voltage discharge circuit to discharge the bit lines to ground potential.

Figure 3:
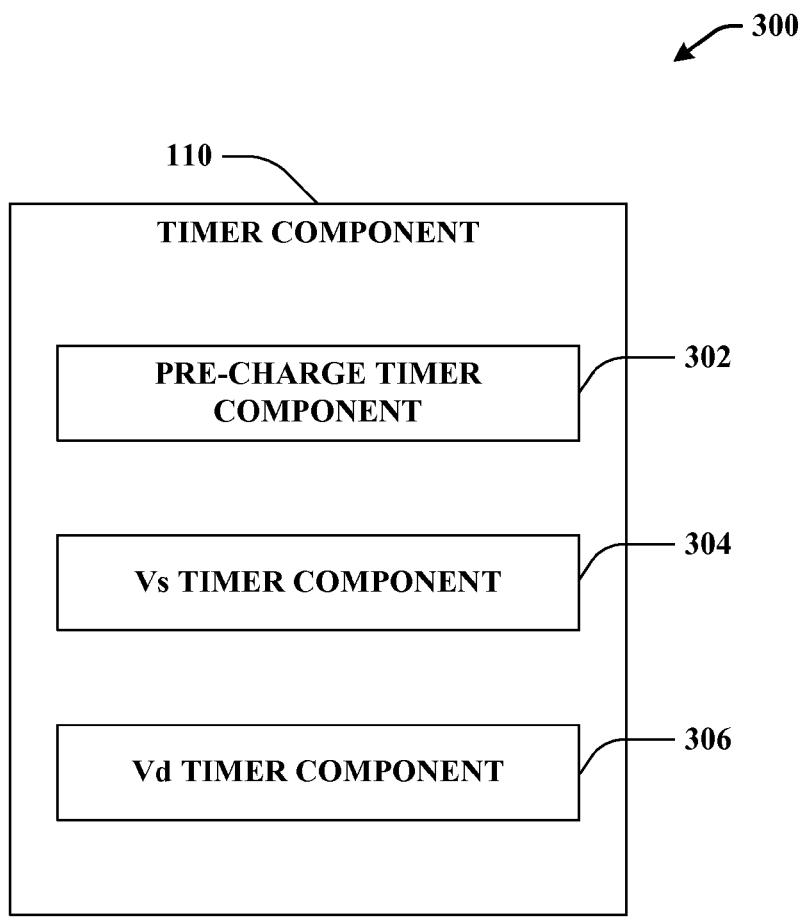
FIG. 3 illustrates an example system that can control the timing of change in voltage levels associated with operations in a memory in accordance with an aspect of the subject specification.

FIG. 3 illustrates an example system 300 that can control the timing of change in voltage levels associated with operations in a memory in accordance with an aspect of the disclosed subject matter. System 300 can include a timer component 110 that can facilitate reducing AC disturbances that can occur in a memory cell during operations (e.g., program, read, erase) performed on the memory cell due in part to difference in the timing of change in bias levels of bit lines in a memory cell. The timer component 108 can ensure that a change in voltage at a particular terminal of a memory cell can occur according to a specified sequence. As an example, the sequence can be predefined and can be determined based in part on testing of the memory, such that, the determined sequence is optimal so that AC disturbances can be at a minimum when the specified sequence is employed.

The timer component 108 can typically include a pre-charge timer component 302 that can be employed to control the timing of pre-charging of bit lines during an operation on a memory cell in the memory. As an example, when gate voltage (Vg) is applied, only then all (or a desired portion of) the bit lines can be pre-charged to a specified voltage level. The pre-charge timer component 302 can ensure that this sequence is maintained. Furthermore, the pre-charge component 302 can ensure that the bit lines are discharged to ground voltage only after the gate voltage is removed.

The timer component can also include a Vs timer component 304 that can maintain a timing sequence for the voltage at the source terminal of a memory cell during an operation on the memory cell. When a memory cell is selected in the memory array to perform an operation, such as, but not limited to, programming, reading and/or erasing, the voltage at the source terminal can be set to a desired predetermined voltage level, such as Vs (e.g. 0.5V). The Vs timer component 304 can ensure that the voltage at the source terminal changes to Vs at an appropriate time as per a specified sequence.

A Vd timer component 306 can be employed to maintain a timing sequence for the voltage at the drain terminal of a memory cell. During an AC operation, the voltage at the drain is set to a desired level Vd (e.g. 4V). The Vd timer component 306 can ensure that the voltage at the drain terminal of a selected memory cell is changed to Vd as per a time specified by the timing sequence. In one aspect, the timing sequence can be structured to ensure that the change in voltages at the source and drain of a selected memory cell can occur at the same or substantially the same time. Furthermore, the voltage level at the source can be lowered to Vs before voltage at the drain reaches Vd, but the sequence can ensure that voltage at the drain cannot reach Vd before the voltage at the source falls to Vs. Due to the change in voltages at the same or substantially the same time, the AC disturbances in the memory cell that can be caused due to electron injection can be minimized.

Figure 4:
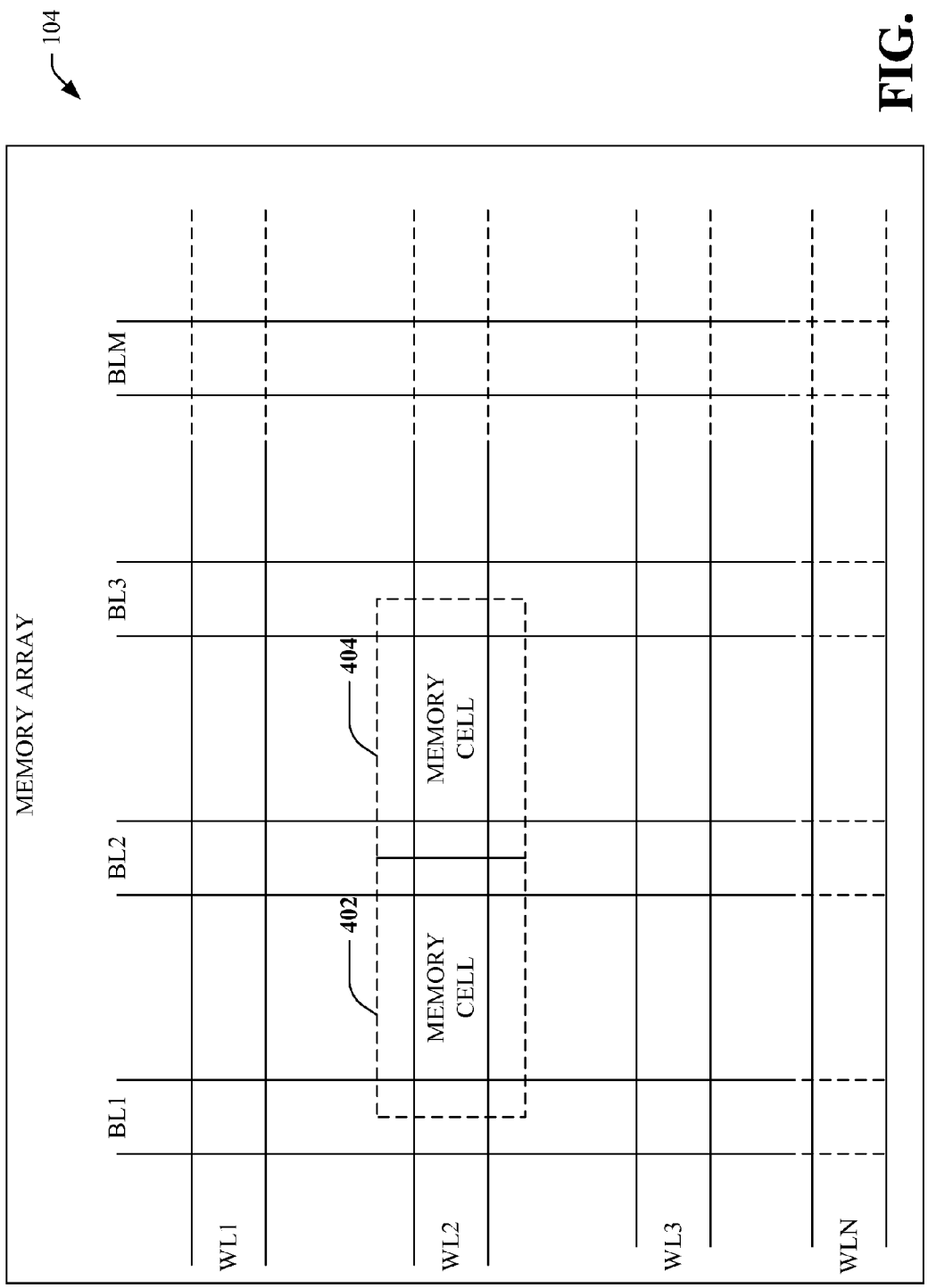
FIG. 4 illustrates an example memory cell in a memory array in a memory, according to an aspect of the system.

Referring to FIG. 4, there illustrated is an example memory cell 402 in a memory array 104, according to an aspect of the system. The memory array 104 can be symmetrically blocked or asymmetrically blocked. Typically, a memory array can include a number of bit lines (BL) and word lines (WL). As shown in the figure, BL1, BL2, BL3 . . . BLM (where M can be a number from 1 to infinity) are bit lines whereas WL1, WL2, WL3 . . . WLN (where N can be a number from 1 to infinity) are word lines. Although only four bit lines and four words lines are shown in the figure, it can be appreciated that there can be M number of bit lines and/or N number of word lines, where N and M each can be an integer number ranging from 1 to infinity.

Figure 10:
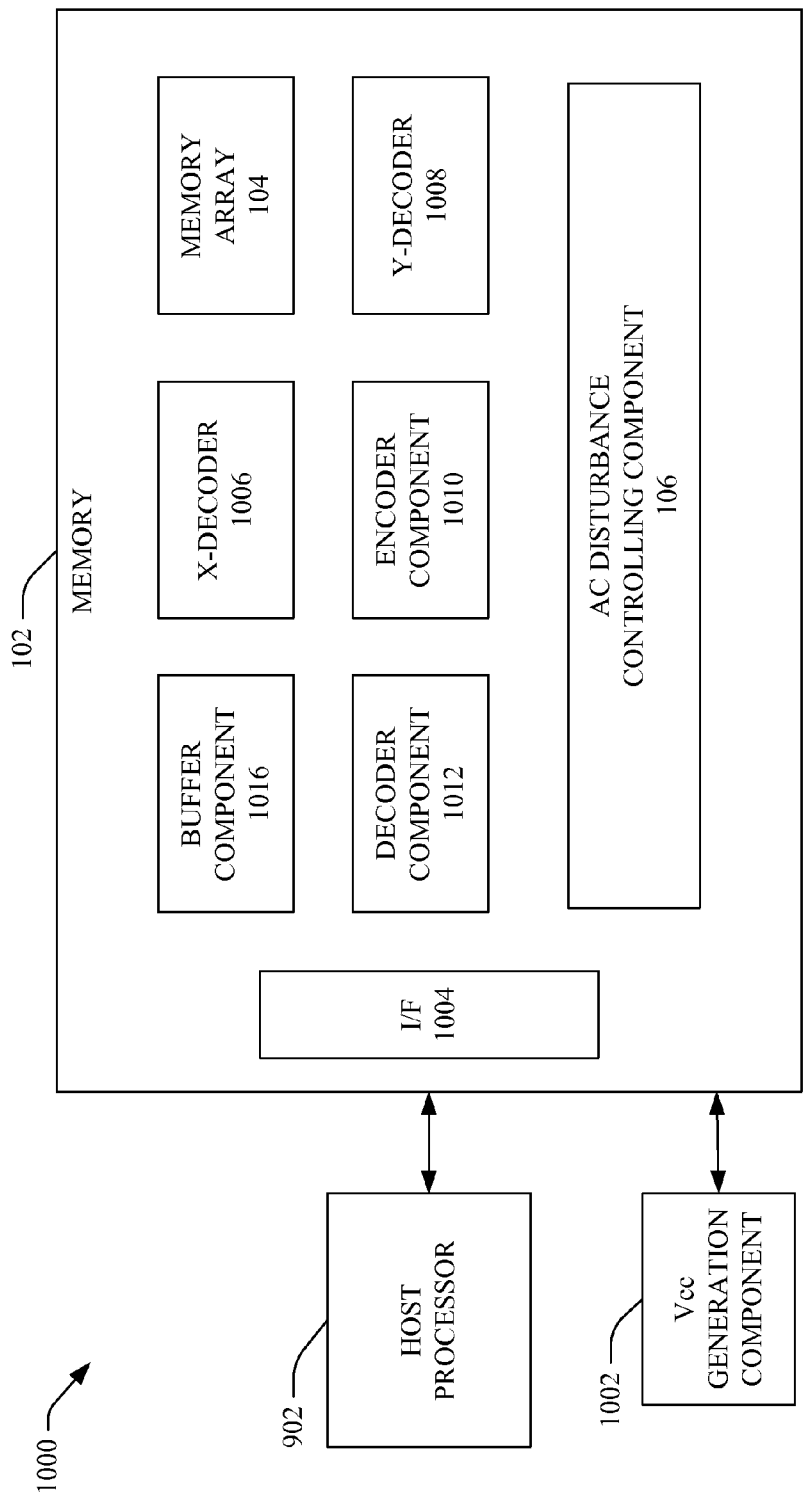
FIG. 10 depicts a block diagram of another system that can reduces AC disturbance associated with operations in a memory in accordance with an aspect of the disclosed subject matter.
Figure 11:
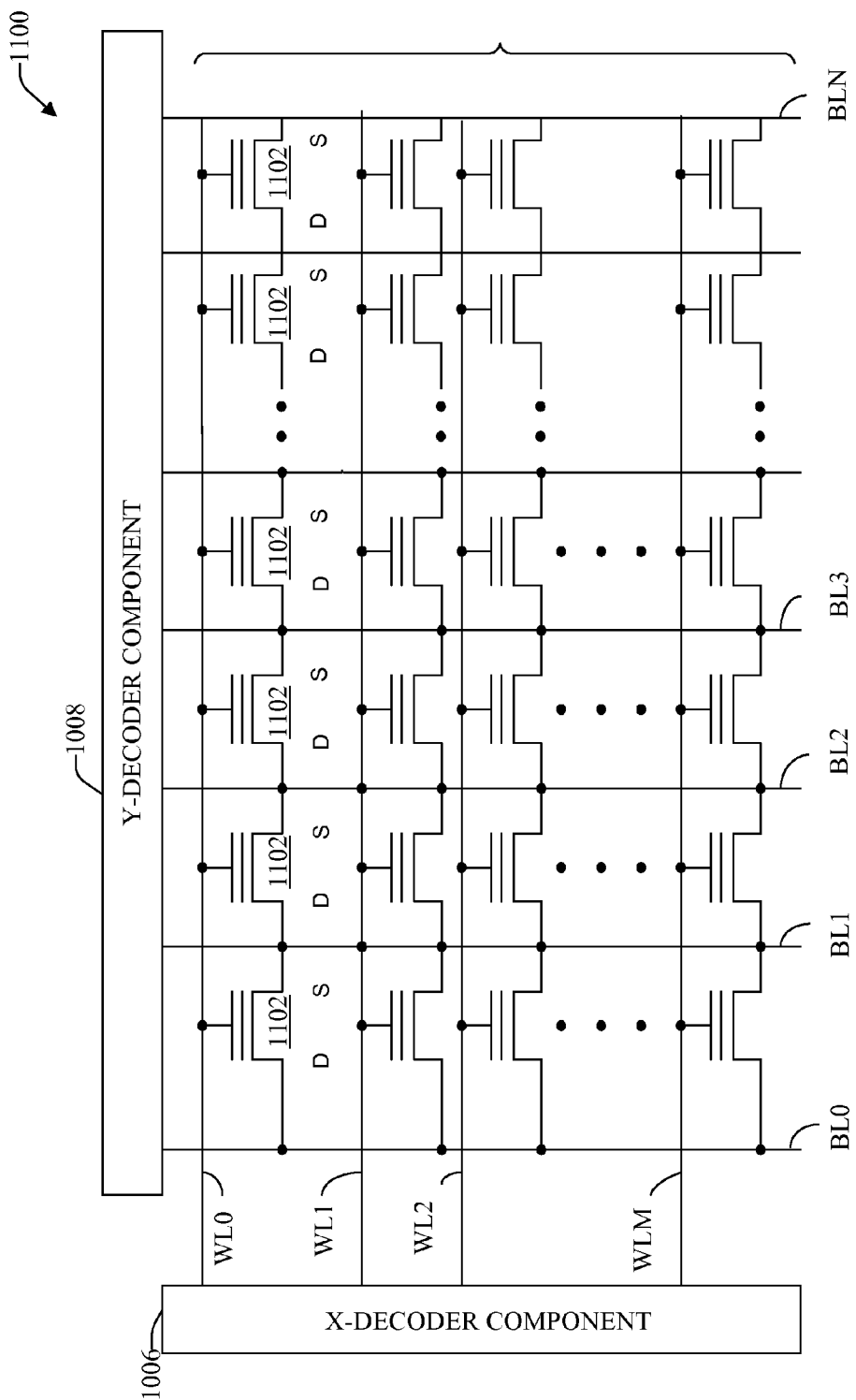
FIG. 11 depicts an example diagram of a memory array in accordance with an aspect of the disclosed subject matter.

To select the memory cell 402, a gate voltage (Vg') can be applied at WL2, for example, by a decoding component (not shown). Once gate voltage is applied, all (or a desired portion of) the bit lines (BL1-BLM) can be pre-charged (by the pre-charge component) to a predetermined voltage level (e.g., Vcc). Further, to select the memory cell 402, voltage can be applied on BL1 and BL2 as per the desired source (Vs') and drain (Vd') voltage, for example, by a decoder component (e.g., Y-decoder component, as illustrated in FIGS. 10 and 11, and described herein). The disclosed system can ensure that the change in voltage occurs at the same or substantially the same time (by employing the timer component 110, as described herein) to reduce AC disturbances within the cell 402. As an example, Vg'=9.5 V, Vs'=0.5V, and Vd'=4V. Since BL3 is pre-charged to Vcc, the voltage difference between BL2 and BL3 is minimal and thus a minimum amount of current can flow between the bit lines through the common word line WL2. Thus, AC disturbance can be minimized.

In conventional systems, BL3 is not pre-charged to Vcc and can be floating and thus close to ground potential (0V). If BL2 is the drain terminal, it can be charged to Vd' and the voltage difference between BL3 and BL2 can be equal to Vd' initially, which is sufficiently large. Furthermore, the WL2 is a common word line and is at a potential of Vg'. Thus, a large amount of current can flow between BL2 and BL3 due to a channel effect, which can lead to false programming of memory cell 404.

In accordance with an aspect of the disclosed subject matter, all the bit lines in a block in memory containing the selected memory cell 404, or at least the bit lines associated with neighbor memory cells (e.g., 404) that are adjacent to memory cell 402 in the block, can be pre-charged during most any AC operation. As a result, AC disturbance, such as false programming of a memory cell due to channel effect, can be reduced and/or eliminated.

Figure 5:
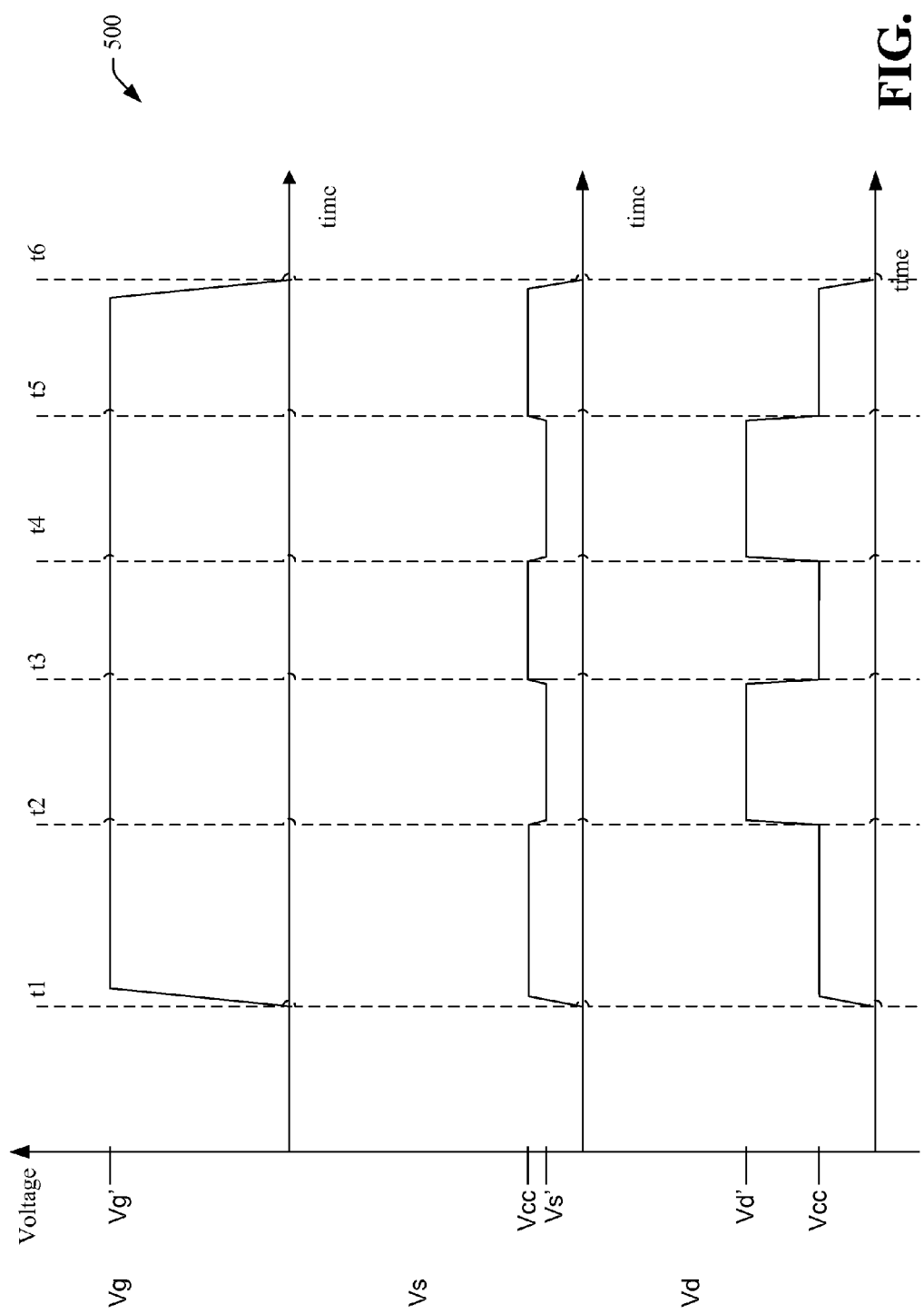
FIG. 5 depicts an example timing diagram of gate, source and drain voltages with respect to time in accordance with an aspect of the disclosed subject matter.

Referring now to FIG. 5, which illustrates a timing diagram 500 of gate, source and drain voltages of a memory cell with respect to time in accordance with an aspect of the system. The memory cell can be part of most any memory array. As seen in the figure, Vg represents the voltage at the gate terminal, Vs represents the voltage at the source terminal and Vd represents the voltage at the drain terminal of the transistor in the memory array.

Until time t1, AC operations are not being performed on a memory cell(s) in the memory array. AC operations can include, but are not limited to, program, erase and/or read operations. Thus, the voltage at each terminal (Vg, Vs and Vd) can be 0V. At time t1, an AC operation can be performed on a memory cell. At this time, all bit lines, or a portion of the bit lines (e.g., the bit lines of the memory cell and neighbor memory cells adjacent thereto), in a block that contains the memory cell can be pre-charged to a specified voltage Vcc (e.g. 1.5V). Thus, as seen in the figure, Vs and Vd associated with the memory cell and desired neighbor memory cells can be pre-charged to Vcc at t1. Furthermore, a gate voltage (Vg') can be applied to the WL associated with the memory cell to be selected, thus Vg can rise to Vg', as depicted in FIG. 5.

At time t2, the memory cell can be selected to perform an AC operation. Until time t2, Vs and Vd can be pre-charged to Vcc. At t2, the desired source and drain voltages can be applied at Vs and Vd to the memory cell, at the same or substantially the same time. Thus, Vs can be lowered to Vs' (e.g. 0.5V) and Vd can rise to Vd' (e.g. 4V) at the same or substantially the same time. It can be appreciated that typically, Vs can be set to Vs' before Vd is set to Vd', but Vd cannot rise to Vd' before Vs reaches Vs'. The timing can be adjusted as per a predetermined sequence that can be employed to minimize disturbances associated with operations on the memory cells. If the timing sequence is mismatched, then the disturbance can be severe and lead to false programming of the cell.

At time t3, the pulse event associated with the operation on the memory cell can be complete and the memory cell can be deselected. Thus, at t3, Vs and Vd can return to the pre-charging voltage level (Vcc). Once again, it can be ensured that Vs and Vd return to Vcc at the same or substantially the same time. It can be appreciated that Vs and Vd do not discharge to ground voltage (0V) until all operations on all cells are complete.

At time t4, the memory cell can be selected to as part of the next pulse event to continue the operation (similar to t2). An AC operation can include a series of pulses wherein a pulse can be defined as an event of rising Vd and falling Vs from pre-charge level. It can be appreciated that although only two pulses are shown in FIG. 5, one or more pulses can be employed to operate on the memory cell during a program operation. During pulsing, all unselected bit lines can float from their pre-charged level. For example, the respective voltage levels associated with unselected bit lines adjacent or close to the source bit line, which can receive the Vs pulse(s), can decay from the pre-charge voltage level, while the respective voltage levels associated with the unselected bit lines adjacent or close to the drain bit line, which can be at Vd, can rise from the pre-charge voltage level. After each pulse event finishes, all bit lines including selected bit lines can be pre-charged (e.g., to Vcc). At t5, the pulse event associated with the memory cell can be complete and the memory cell can be deselected (similar to t3). The cycle of pulse events can repeat, as desired, until all pulse events associated with the operation on the cell are completed.

AC operations on the cells can be completed at time t6 (e.g., as depicted in FIG. 5; or there can be one or more pulse events depending on the program operation). Thus, gate voltage, Vg', can be removed and Vg=0V. This indicates that no other AC operations are being performed on memory cells in the memory array and hence, all the bit lines can be discharged. At t6, Vs and Vd can be discharged to ground potential, as shown in the figure. If any other AC operation is performed bit lines can be pre-charged again as shown at t1, and the cycle can repeat.

FIGS. 6, 7A, 7B, 8A, and 8B illustrate methodologies and/or flow diagrams in accordance with the disclosed subject matter. For simplicity of explanation, the methodologies are depicted and described as a series of acts. It is to be understood and appreciated that the subject innovation is not limited by the acts illustrated and/or by the order of acts, for example acts can occur in various orders and/or concurrently, and with other acts not presented and described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Figure 6:
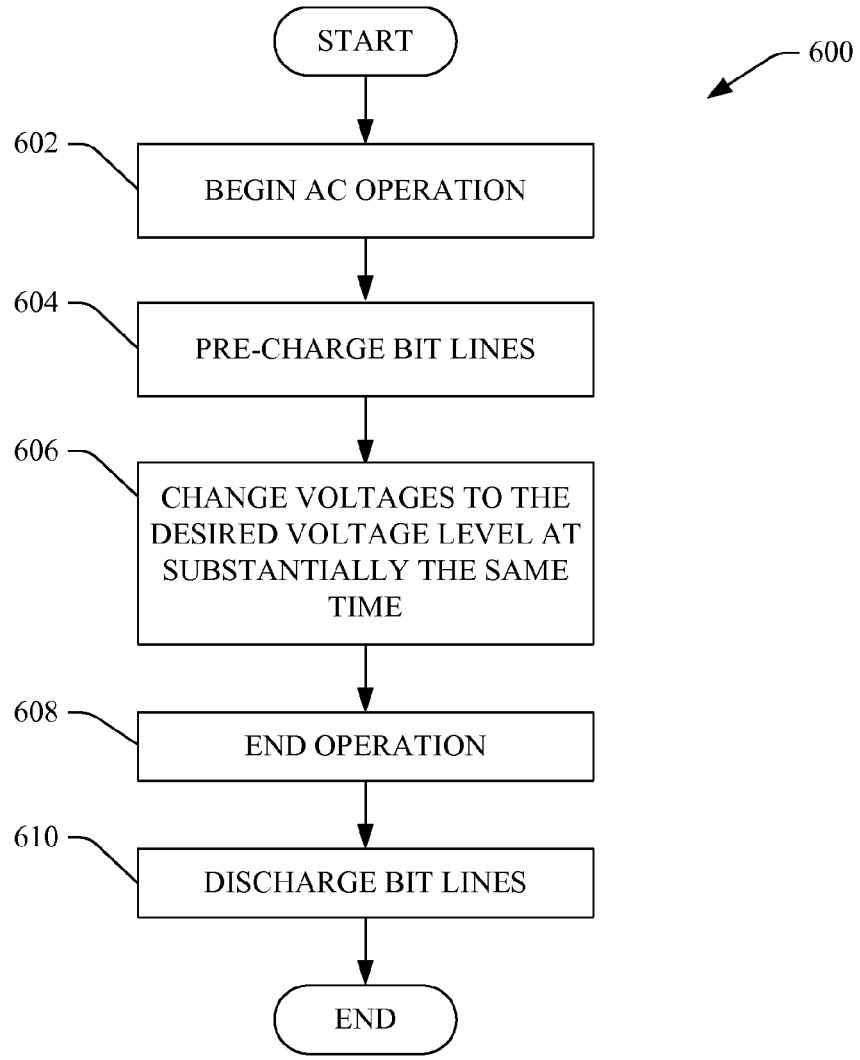
FIG. 6 illustrates a methodology that can reduce disturbances in memory during an AC operation, according to an aspect of the disclosed subject specification.

Referring now to FIG. 6, illustrated a methodology 600 that can reduce disturbances in memory during an AC operation, according to an aspect of the disclosed subject specification. At 602, an AC operation such as, but not limited to, memory read, memory erase and/or memory program can be initiated. For example, a processor component can generate a command(s) and can provide the command to the memory. The AC operation can be performed on most any memory cell in a memory array. At 604, all, or a subset of the bit lines (e.g., the bit lines associated with the desired memory cell and neighbor memory cells adjacent to the memory cell in the block), in a block in the memory array containing a desired memory cell (e.g., selected memory cell), including the source and drain terminals of the selected memory cell, can be pre-charged to a specified predetermined voltage level. Since bit lines neighboring the selected memory cell are pre-charged, a minimal current can leak into the neighboring cells, which can thereby reduce AC disturbances conventionally associated with operations performed in the memory.

At 606, voltages at the source and drain terminals of the selected memory cell can be set to desired predetermined levels at the same or substantially the same time. Since the voltages change at the same or substantially the same time, disturbances due to electron injection can be reduced. For example, the voltage at the source and drain terminals of the memory cell can be changed to desired voltage (e.g. Vs=0.5V, Vd=4V) at the same or substantially the same time, and the memory cell can be pulsed as part of the programming of the selected memory cell. During the AC operation, the unselected bit lines can float, where the respective voltage levels of unselected bit lines adjacent or close to the source bit line, which is at Vs, can decay from the Vcc level, since Vs is lower than Vcc; and the respective voltage levels of unselected bit lines adjacent or close to the drain bit line, which can be at Vd, can rise from the Vcc level, since Vd is greater than Vcc. The AC operation can include one or more pulses to perform the operation on the selected cell. At 608, the AC operation can end when all the pulses have ended. At 610, the bit lines that were pre-charged in the block memory array can be discharged to zero volts. The bit lines can stay at ground potential when AC operations are not being performed on the memory, however, during any AC operation steps 602-610 can be repeated. At this point, methodology 600 can end.

Figure 7A:
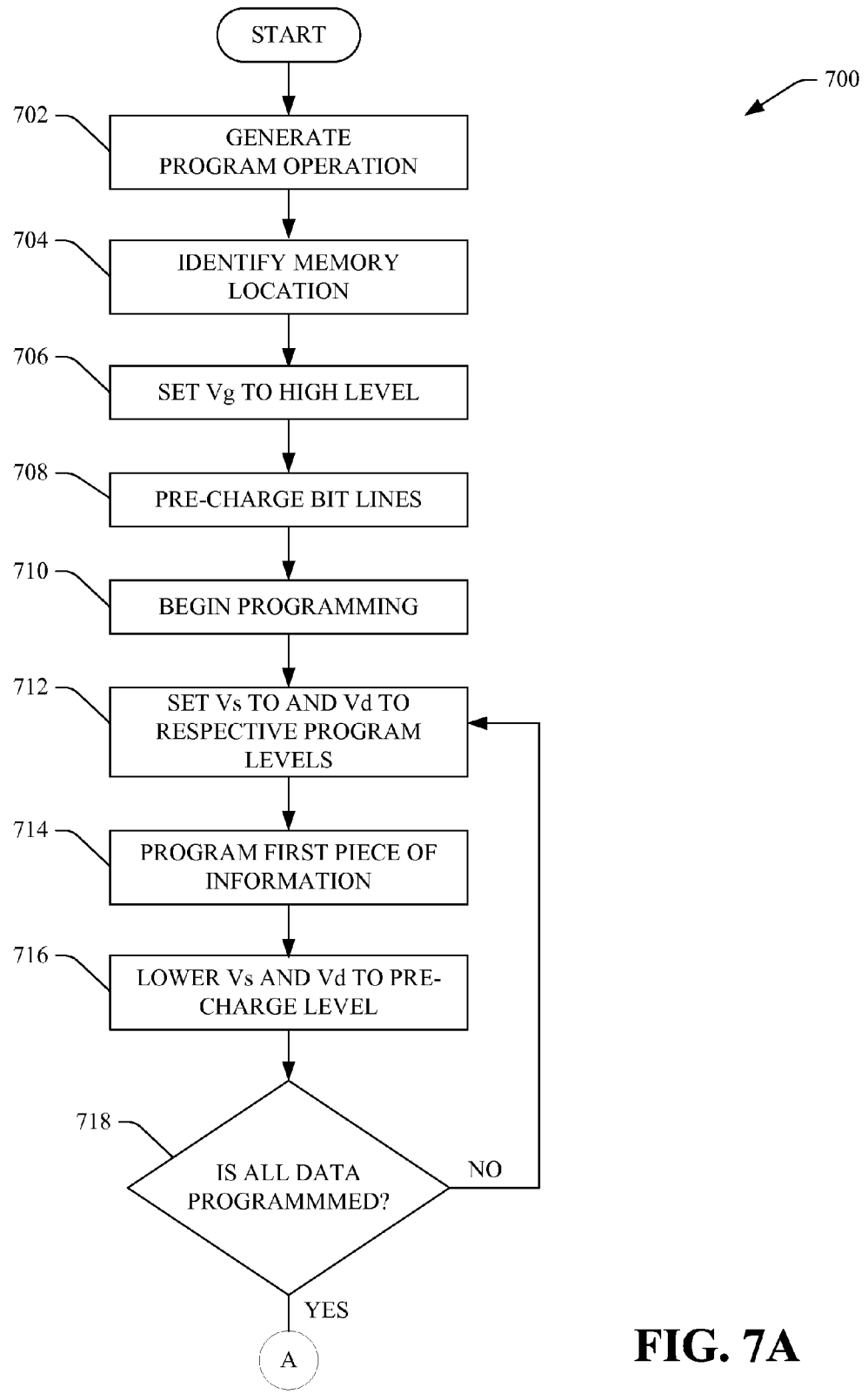
FIGS. 7A-B illustrate a methodology that can facilitate AC disturbance minimization by pre-charging bit lines according to an aspect of the disclosed subject matter.
Figure 7B:
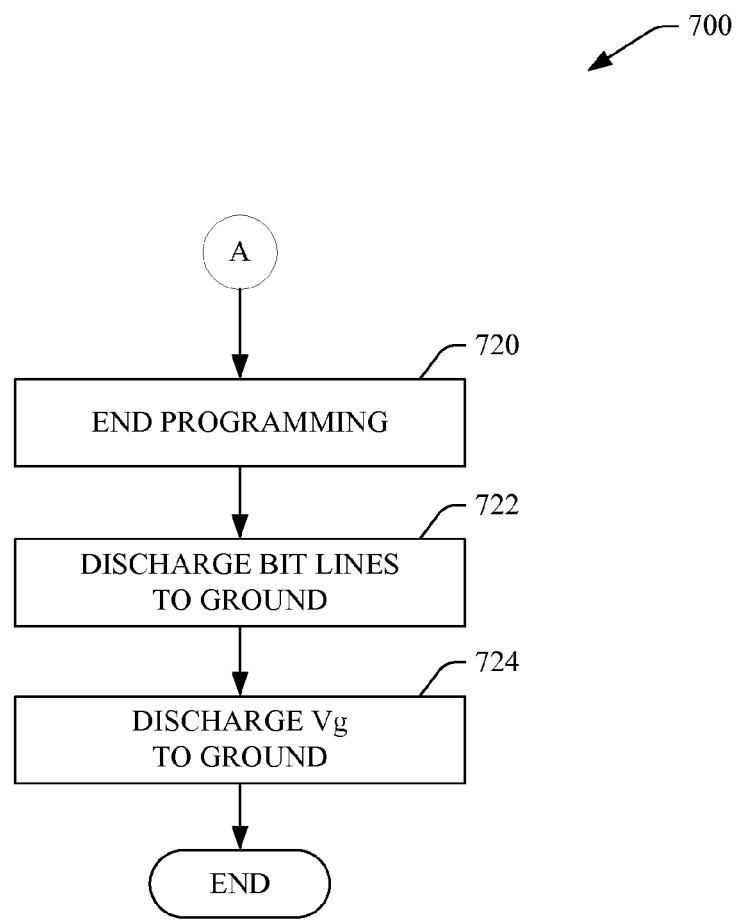

Referring to FIGS. 7A-B, illustrated is a methodology 700 that can facilitate AC disturbance minimization by pre-charging bit lines of a memory, according to an aspect of the disclosed subject matter. At 702, a program operation can be generated. It can be appreciated that most any AC operation can be initiated, for example, read, erase and/or program. At 704, a memory location (e.g., memory cell) on which the operation is to be performed can be identified and/or selected. As an example, the memory location can be selected by an identifying an address on an address bus. As shown at 706, a gate voltage (Vg) can be applied at the selected memory cell. For example, Vg can be set at 9.5V.

At 708, all or a desired portion of the bit lines in a block of the memory array can be pre-charged to a specified voltage (Vcc), provided Vg is high. In one aspect, all bit lines of a block wherein the selected memory cell is located can be pre-charged to the predetermined voltage, Vcc. In accordance with another aspect, the bit lines of the selected memory cell and neighbor memory cells adjacent to the selected memory cell in the block can be pre-charged to the predetermined voltage, Vcc. Vcc can be most any specified voltage that can be externally supplied and/or internally derived. As an example, all or a portion of the bit lines in the block can be set to 1.5V. At 710, the selected memory cell can be programmed, once the desired bit lines have been pre-charged to Vcc. At 712, the voltage at surface and drain can be set to a desired source and drain voltage. For instance, the voltage at the source and drain terminals of the memory cell can be changed to desired voltage (e.g. Vs=0.5V, Vd=4V) at the same or substantially the same time, and the selected memory cell can be pulsed as part of the AC programming of the selected memory cell. At 714, the AC operation can be performed. During the AC operation, the unselected bit lines can float, where the respective voltage levels of unselected bit lines adjacent or close to the source bit line, which is at Vs, can decay from the Vcc level, since Vs is lower than Vcc; and the respective voltage levels of unselected bit lines adjacent or close to the drain bit line, which can be at Vd, can rise from the Vcc level, since Vd is greater than Vcc. The AC operation can be a series of one or more pulses and acts 712 to 714 can be repeated for each pulse. As shown at 716, on completion of the operation, the respective voltages at the source and drain can be set back to the pre-charge voltage of Vcc. At 718, a determination can be made regarding whether all data has been programmed (e.g., whether there are more pulse events associated with the AC program operation). If it is determined that all the data has not been programmed, methodology 700 can return to reference numeral 712 to continue programming the remaining data. If, at 718, it is determined that all data is programmed, at 720, the operation can be completed. At 722, all the pre-charged bit lines in the memory array can be discharged to ground potential (0V). At 724, the gate voltage can be removed and the gate can be discharged to 0V.

Figure 8A:
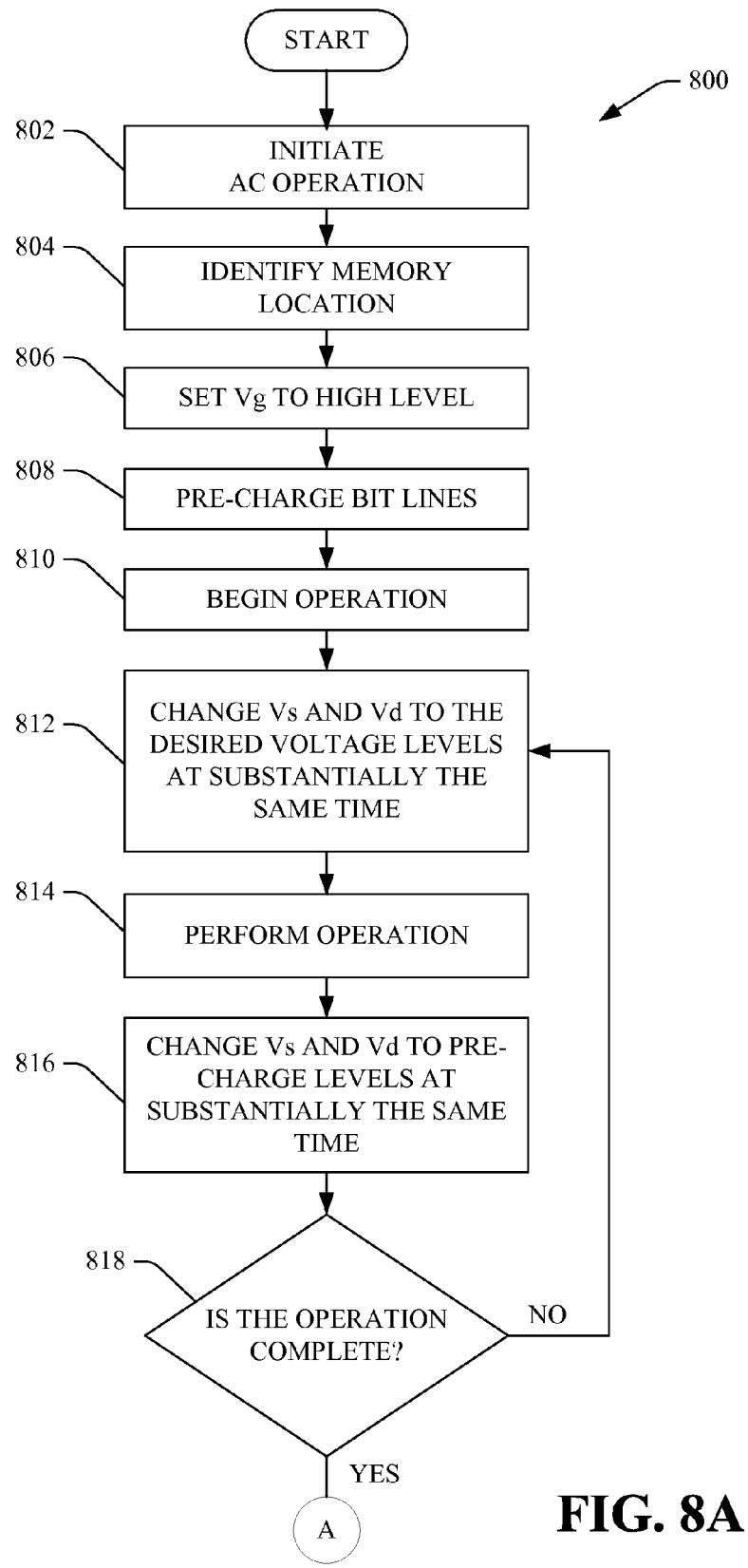
FIGS. 8A-B illustrate a methodology hat can facilitate AC disturbance minimization by changing the voltage at source and drain at substantially at the same time during operations associated with a memory in accordance with an aspect of the disclosed subject matter.
Figure 8B:
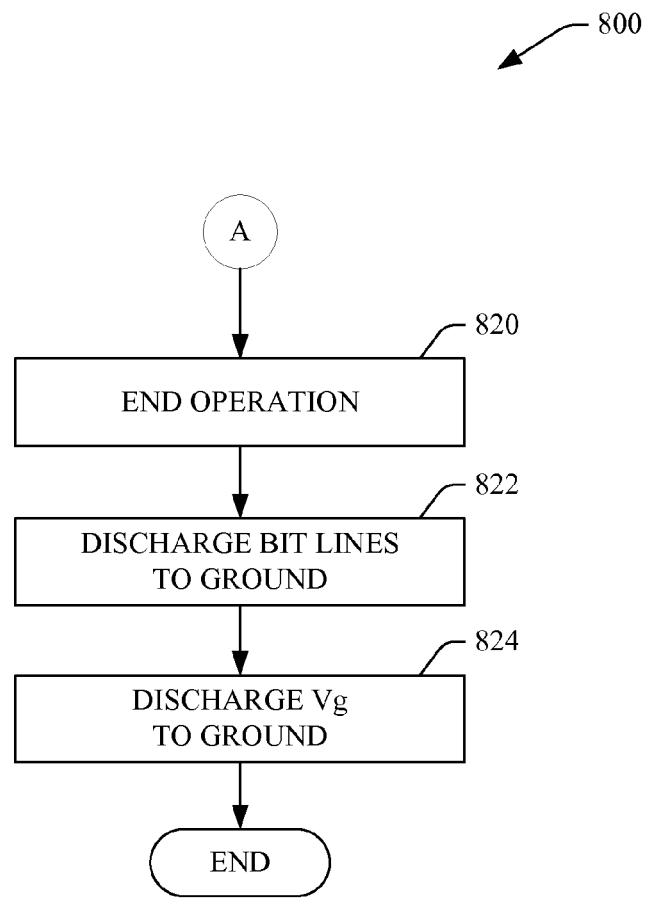

Referring now to FIGS. 8A-B, illustrated is a methodology 800 that can facilitate AC disturbance minimization associated with an operation on a selected memory cell(s) in a memory in accordance with an aspect of the disclosed subject matter. At 802, an AC operation can be initiated. For example, a processor component can generate a command(s) and can provide the command to the memory. The operation can include, but is not limited to, a program, read and/or erase operation. At 804, a memory location can be identified, such that the operation can be performed on the identified memory location. At 806, gate Voltage (Vg) can be set high (e.g. 9.5V) to select the identified memory cell. Thus, the word line associated with the selected memory cell can be set to the high voltage. At 808, all or a desired portion of the bit lines (e.g., all bit lines in a block; or bit lines of selected memory cell and neighbor memory cells adjacent thereto) in a block in the memory array can be pre-charged to a voltage, Vcc. It can be appreciated that all or a desired portion of the bit lines can be pre-charged at the same or substantially the same time. At, 810, the AC operation can begin, as the source and drain voltages can be set to respective desired predetermined voltages (e.g. Vs=0.5V, Vd=4V). At 812, the source and drain voltages can be changed to the respective desired predetermined voltages at the same or substantially the same time, as this can facilitate reducing and/or eliminating AC disturbances during the operation.

At 814, the operation can be performed on the selected memory cell via one or more pulses. At 816, the source voltage, Vs, and drain voltage, Vd, can be returned to the pre-charge voltage level (e.g., Vcc). At 818, it can be determined if the AC operation has been completed. For example, it can be determined whether there are more pulse events to be performed with regard to the AC programming operation. If it is determined that the operation is not complete, methodology 800 can return to reference numeral 812 to continue from that point. If, at 818, it is determined that there is no other operation(s) to be performed, at 820, the operation can be completed. At 822, all the pre-charged bit lines that were pre-charged to Vcc can be discharged to ground potential at the same or substantially the same time. At 824, the gate voltage can be removed and discharged to zero volts. At this point, methodology 800 can end.

Figure 9:
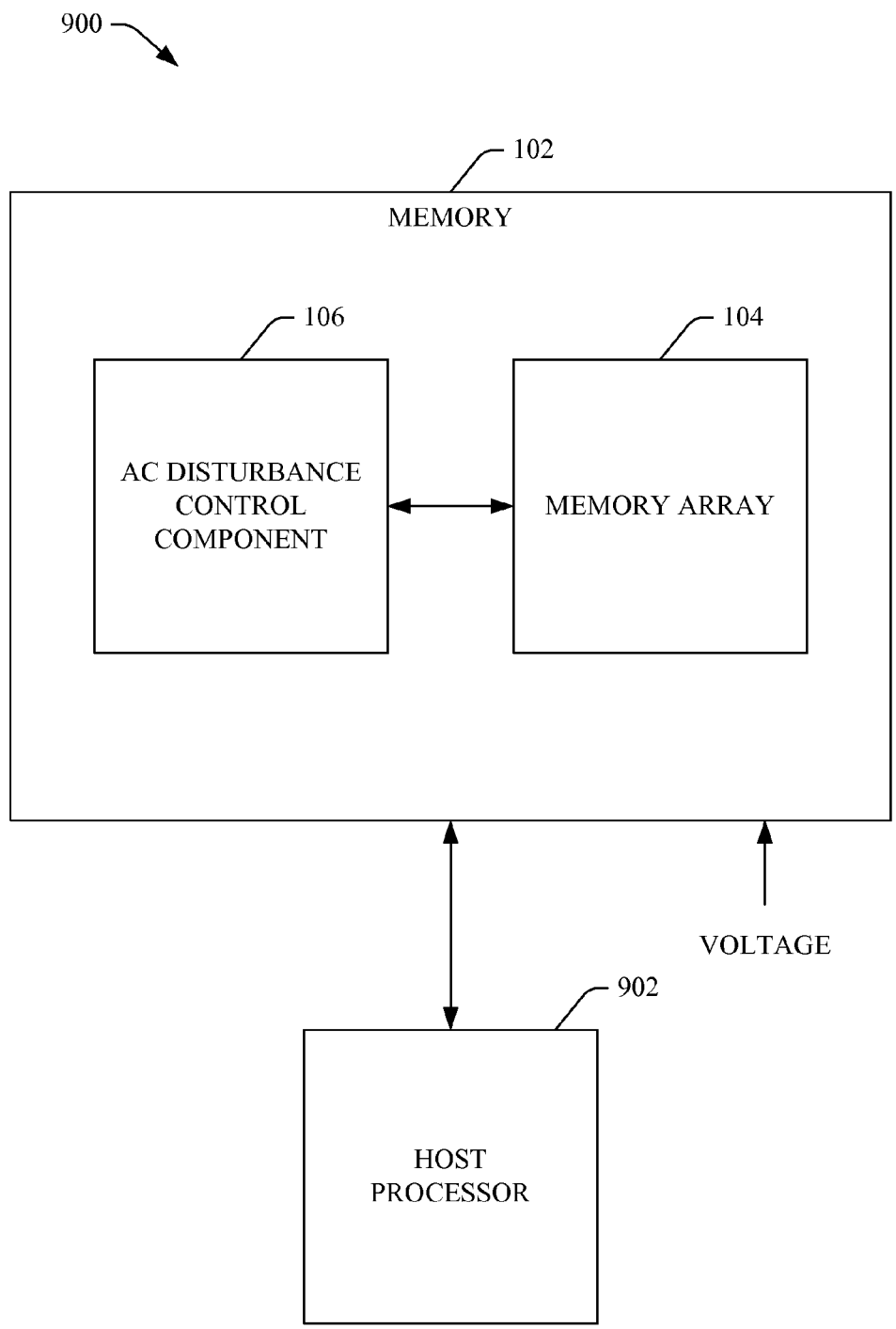
FIG. 9 illustrates an example system that can minimize AC disturbance associated with operations in a memory in accordance with an aspect of the subject specification.

Referring now to FIG. 9, there illustrated is an example system 900 that can minimize AC disturbance associated with a memory in accordance with an aspect of the subject specification. The system can include a memory 102 that can be a non-volatile memory such as a flash memory (e.g., single-bit flash memory, multi-bit flash memory). The memory 102 can be comprised of NOR flash memory and/or NAND flash memory, for example. The memory 102 can include a memory array 104 that can be comprised of a plurality of memory cells (not shown) wherein data can be stored, as more fully described herein.

The memory 102 can further include an AC disturbance control component 106 that can minimize AC disturbance that can occur during programming of memory cells in the memory 102. For instance, the AC disturbance control component 106 can pre-charge all or a subset of the bit lines in a block of the memory 102 during an AC operation, as well as, ensure that Vd and Vs levels are changed at the same or substantially the same time during the operation on a selected memory cell. Furthermore, memory 102 can also include a voltage source that can include a voltage pump that can regulate a voltage level and thus can regulate Vg, Vs, and Vd. An external voltage can also be provided to pre-charge bit lines during AC operations as illustrated in the FIG. 9.

Typically, the system can include a host processor 902 associated with the memory 102 that can issue commands. The host processor 902 can be a typical applications processor that can manage communications and run applications. For example, the host processor 902 can be a processor that can be utilized by a computer, a mobile handset, personal data assistant (PDA), or other electronic device.

The host computer 902 can issues commands to initiate an operation, such as, but not limited to, a program, read or erase operation. When the AC operation is initiated, all or a desired subset of the bit lines (e.g., all bit lines in a block; or the bit lines associated with the selected memory cell and neighbor memory cells adjacent thereto) in the memory 102 can be pre-charged to a specified voltage Vcc. As a result, AC disturbances to memory cells in the memory 102 can be reduced and/or eliminated. The pre-charge voltage can be supplied externally. During the AC operation, the gate, source, and drain voltages of the selected memory cell can be set to desired levels at the same or substantially the same time. This can further reduce AC disturbances in a memory cell (e.g., neighbor memory cell). The host processor 902 can perform the AC operation and on its completion, the bit lines and word lines in memory 102 can be discharged to ground potential.

Referring to FIG. 10, depicted is a block diagram of another system 1000 that can reduce AC disturbance associated with a memory in accordance with the disclosed subject matter. System 1000 illustrates various components of memory 102 associated with a host processor 902. Typically, a Vcc generation component 1002 can be included in system 1000, which can provide the Vcc voltage to pre-charge the bit lines, as desired, in the memory 102. The Vcc generation component 1002 can be an external power supply or can comprise of most any circuit that can provide a constant or substantially constant voltage (e.g., Vcc). It can be appreciated that the memory 102, memory array 104, and AC disturbance control component 106 can each include their respective functionality, as more fully described herein, for example, with regard to systems 100, 900.

System 1000 can contain a host processor 902 that can be associated with the memory 102. In accordance with an embodiment of the disclosed subject matter, the host processor 902 can generate commands, including read, write, and/or erase commands, in order to facilitate reading data from, writing data to, and/or erasing data from the memory 102, where the communication of information between the host processor 902 and the memory 102 can be facilitated via an interface component 1004 (hereinafter also referred to as "I/F 1004").

I/F 1004 can include and/or provide various adapters, connectors, channels, communication paths, etc. to integrate the memory 102 into virtually any operating and/or database system(s) and/or with one another system(s). In addition, I/F 1004 can provide various adapters, connectors, channels, communication paths, etc., that can provide for interaction and/or communication with the host processor 902, and/or any other component, data, and the like, associated with the system 1000.

The memory 102 can include an X-decoder component 1006 and a Y-decoder component 1008 that can be associated with the memory array 104 and can each respectively decode inputs/outputs during various operations (e.g., programming, reading, verifying, erasing) that can be performed on the memory cells (not shown), as more fully described herein. For example, the X-decoder component 1006 and Y-decoder component 1008 can each receive address bus information, which can be provided as part of a command from the host processor 902 or a command from a memory controller component (not shown) within the memory 102, and such information can be utilized to facilitate determining the desired memory location in the memory 102.

The memory 102 can also contain an encoder component 1010 that can facilitate encoding data being programmed to the memory 102. For example, the encoder component 1010 can facilitate converting a digital signal to an analog signal (e.g., current level) to facilitate programming data in the memory locations (e.g., memory cells) in the memory 102.

The memory 102 can further include a decoder component 1012 that can facilitate decoding data being read from the memory 102. The decoder component 1012 can receive an analog signal associated with data, where the analog signal can be stored in the memory location in the memory array 104, and can facilitate converting the analog signal to a digital signal, so that such digital signal representing the read data can be provided to another component (e.g., host processor 902, cryptographic component (as described herein), etc.) for further processing.

Turning, to FIG. 11, depicted is an example diagram 1100 of a memory array 104 (e.g., as illustrated in FIG. 1 and described herein) that can be employed in a memory 102 (e.g., as illustrated in FIG. 1 and described herein) in accordance with an aspect of the disclosed subject matter. The diagram 1100 of the memory array 104 can include a plurality of memory cells 1102 that each can be comprised of a drain, gate, and source. Each memory cell 1102 can have one or more levels therein and can thereby store one or more bits of data therein, where each level can be associated with a bit of data. It is to be appreciated that a memory cell 1102 can be the same or substantially the same as memory cell 402 and/or memory cell 404, as illustrated in FIG. 4 and described herein. The memory array 104 can be included in a memory 102 (not shown in its entirety). The memory array 104 can be associated with an X-decoder component 1006 (e.g., WL decoder) and a Y-decoder component 1008 (e.g., BL decoder) that can each respectively decode inputs/outputs during various operations (e.g., programming, reading, verifying, erasing) that can be performed on the memory cells 1102. The X-decoder component 1006 and Y-decoder component 1008 can each receive address bus information from a host processor (e.g., 902) and/or system controller (not shown) or the like, and can utilize such information to facilitate accessing or selecting the desired memory cell(s) (e.g., memory location(s)) associated with the command. The memory cells 1102 can be formed in M rows and N columns. A common WL (word line) can be attached to the gate of each memory cell 1102 in a row, such as word-lines WL0, WL1, WL2, through WLM. A common BL (bit line) can be attached to each cell 1102 in a column, such as bit-lines BL0, BL1, through BLN. A WL can contain, for example, 1024 elements forming multiple words and a sector can include, for example, 512 WLs to provide at least 512 k elements of memory. In accordance with an aspect of the disclosed subject matter, respective voltages can be applied to one or more cells 1102 through the WLs and BLs to facilitate performing operations, such as program, read, erase, and the like.

Figure 12:
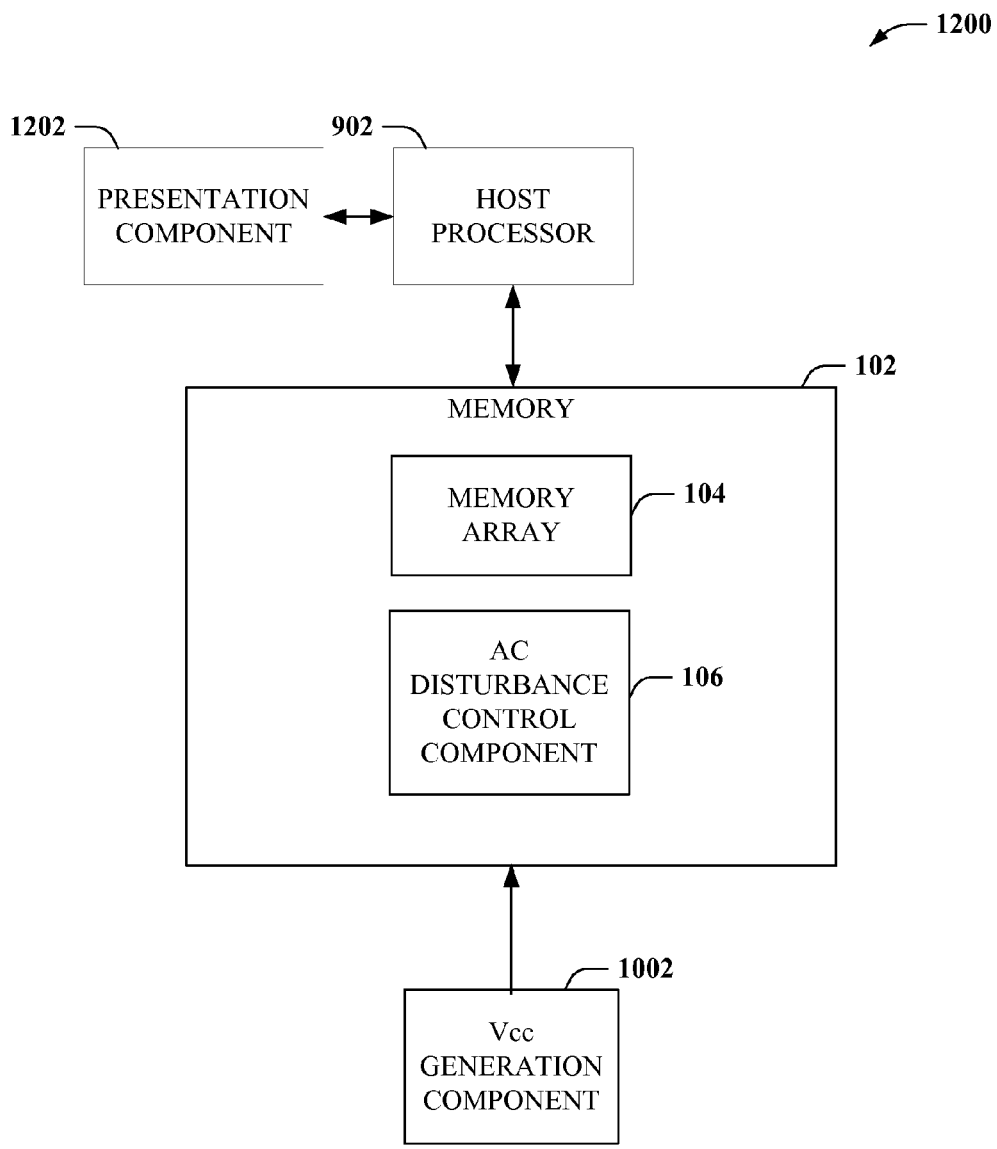
FIG. 12 depicts a block diagram of a system that can minimize AC disturbance associated with operations in a memory in accordance with the disclosed subject matter.

Turning to FIG. 12, depicted is a system 1200 that can minimize AC disturbances in a memory during operations in accordance with an aspect of the disclosed subject matter. System 1200 can include a host processor 902, memory 102 (e.g., flash memory), an AC disturbance control component 106, and a Vcc generation component 902 that each can be substantially similar to respective components and can include such respective functionality as described herein, for example, with regard to system 100, system 200, system 300, system 900, and/or system 1000.

System 1200 also can include a presentation component 1202, which can be associated with the host processor 902. The presentation component 1202 can provide various types of user interfaces to facilitate interaction between a user and any component coupled to the host processor 902. As depicted, the presentation component 1202 is a separate entity that can be utilized with the host processor 902 and associated components. However, it is to be appreciated that the presentation component 1202 and/or similar view components can be incorporated into the host processor 902 and/or a stand-alone unit. The presentation component 1202 can provide one or more graphical user interfaces (GUIs), command line interfaces, and the like. For example, a GUI can be rendered that provides a user with a region or means to load, import, read, etc., data, and can include a region to present the results of such. These regions can comprise known text and/or graphic regions comprising dialogue boxes, static controls, drop-down-menus, list boxes, pop-up menus, as edit controls, combo boxes, radio buttons, check boxes, push buttons, and graphic boxes. In addition, utilities to facilitate the presentation such as vertical and/or horizontal scroll bars for navigation and toolbar buttons to determine whether a region will be viewable can be employed. For example, the user can interact with one or more of the components coupled to and/or incorporated into the host processor 902.

The user can also interact with the regions to select and provide information via various devices such as a mouse, a roller ball, a keypad, a keyboard, a pen and/or voice activation, for example. Typically, a mechanism such as a push button or the enter key on the keyboard can be employed to facilitate entering the information in order to initiate the search. However, it is to be appreciated that the claimed subject matter is not so limited. For example, merely highlighting a check box can initiate information conveyance. In another example, a command line interface can be employed. For example, the command line interface can prompt (e.g., via a text message on a display and an audio tone) the user for information via providing a text message. The user can than provide suitable information, such as alpha-numeric input corresponding to an option provided in the interface prompt or an answer to a question posed in the prompt. It is to be appreciated that the command line interface can be employed in connection with a GUI and/or API. In addition, the command line interface can be employed in connection with hardware (e.g., video cards) and/or displays (e.g., black and white, and EGA) with limited graphic support, and/or low bandwidth communication channels.

Figure 13:
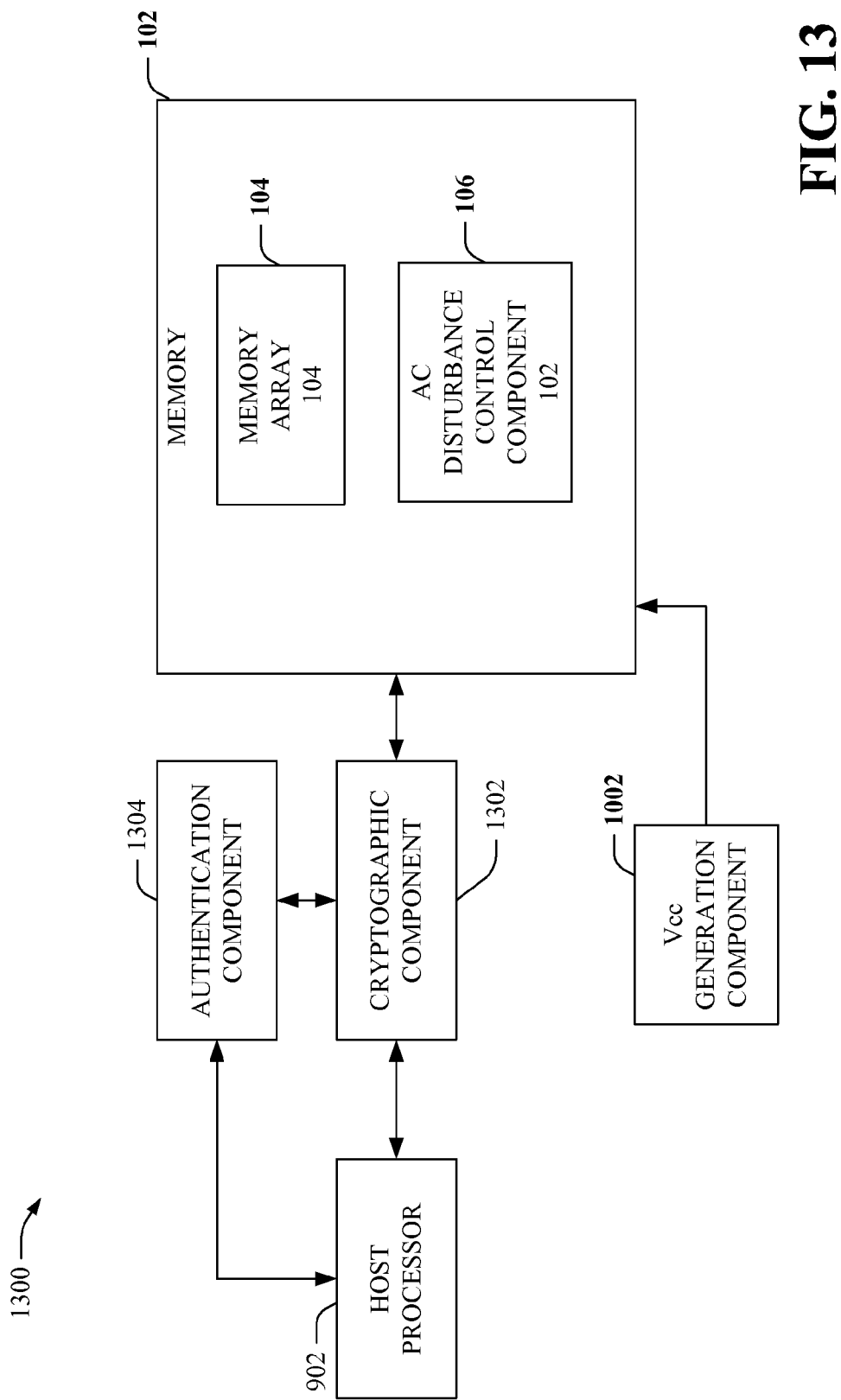
FIG. 13 illustrates a block diagram of a system that can facilitate disturbance minimization during AC operations associated with secure data associated with a memory in accordance with the disclosed subject matter.

Referring to FIG. 13, a block diagram of a system 1300 that can facilitate a reduction in AC disturbances in a memory associated with operations that involve secured data in accordance with an aspect of the disclosed subject matter is illustrated. System 1300 can include a host processor 902 that can be associated with a memory 102, which can be a flash memory device, for example. The memory 102 can include a memory array 104 in which data can be stored and an AC disturbance control component 106 that can minimize disturbance during AC operations. It is to be appreciated that the memory 102, memory array 104, AC disturbance control component 106, host processor 902, and Vcc generation component can each include their respective functionality, as more fully described herein, for example, with regard to system 100, system 200, system 300, system 900, and/or system 1000.

The host processor 902 can be associated with a cryptographic component 1302 that can facilitate encrypting and/or decrypting data to facilitate securing data being written to, stored in, and/or read from the memory 102. In accordance with an aspect of the disclosed subject matter, cryptographic component 1302 can provide symmetric cryptographic tools and accelerators (e.g., Twofish, Blowfish, AES, TDES, IDEA, CASTS, RC4, etc.) to facilitate securing data. Cryptographic component 1302 can also provide asymmetric cryptographic accelerators and tools (e.g., RSA, Digital Signature Standard (DSS), and the like) to facilitate data security. Additionally, cryptographic component 1302 can provide accelerators and tools (e.g., Secure Hash Algorithm (SHA) and its variants such as, for example, SHA-0, SHA-1, SHA-224, SHA-256, SHA-384, and SHA-512) to facilitate securing data.

System 1300 can further include an authentication component 1304 that can solicit authentication data from an entity, and, upon the authentication data so solicited, can be employed, individually and/or in conjunction with information acquired and ascertained as a result of biometric modalities employed, to facilitate control access to the memory 102. The authentication data can be in the form of a password (e.g., a sequence of humanly cognizable characters), a pass phrase (e.g., a sequence of alphanumeric characters that can be similar to a typical password but is conventionally of greater length and contains non-humanly cognizable characters in addition to humanly cognizable characters), a pass code (e.g., Personal Identification Number (PIN)), and the like, for example. Additionally and/or alternatively, public key infrastructure (PKI) data can also be employed by authentication component 1304. PKI arrangements can provide for trusted third parties to vet, and affirm, entity identity through the use of public keys that typically can be certificates issued by the trusted third parties. Such arrangements can enable entities to be authenticated to each other, and to use information in certificates (e.g., public keys) and private keys, session keys, Traffic Encryption Keys (TEKs), cryptographic-system-specific keys, and/or other keys, to encrypt and decrypt messages communicated between entities.

The authentication component 1304 can implement one or more machine-implemented techniques to identify an entity by its unique physical and behavioral characteristics and attributes. Biometric modalities that can be employed can include, for example, face recognition wherein measurements of key points on an entity's face can provide a unique pattern that can be associated with the entity, iris recognition that measures from the outer edge towards the pupil the patterns associated with the colored part of the eye—the iris—to detect unique features associated with an entity's iris, and finger print identification that scans the corrugated ridges of skin that are non-continuous and form a pattern that can provide distinguishing features to identify an entity.

In accordance with one embodiment of the disclosed subject matter, the memory 102, the cryptographic component 1302, and the authentication component 1304 can be situated or implemented on a single integrated-circuit chip. In accordance with another embodiment, the memory 102, the cryptographic component 1302, and the authentication component 1304 can be implemented on an application-specific integrated-circuit (ASIC) chip.

Figure 14:
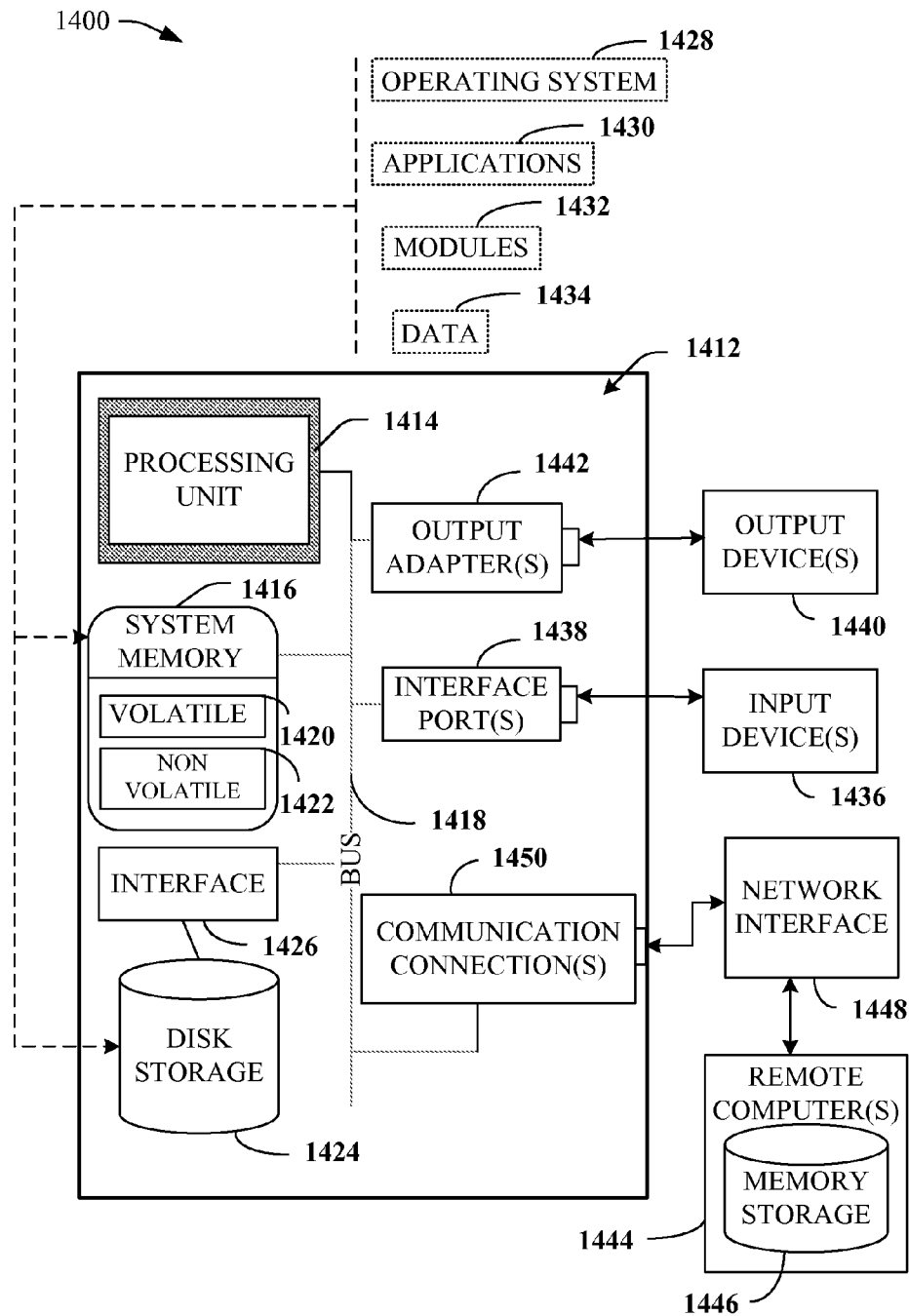
FIG. 14 is a schematic block diagram illustrating a suitable operating environment.
Figure 15:
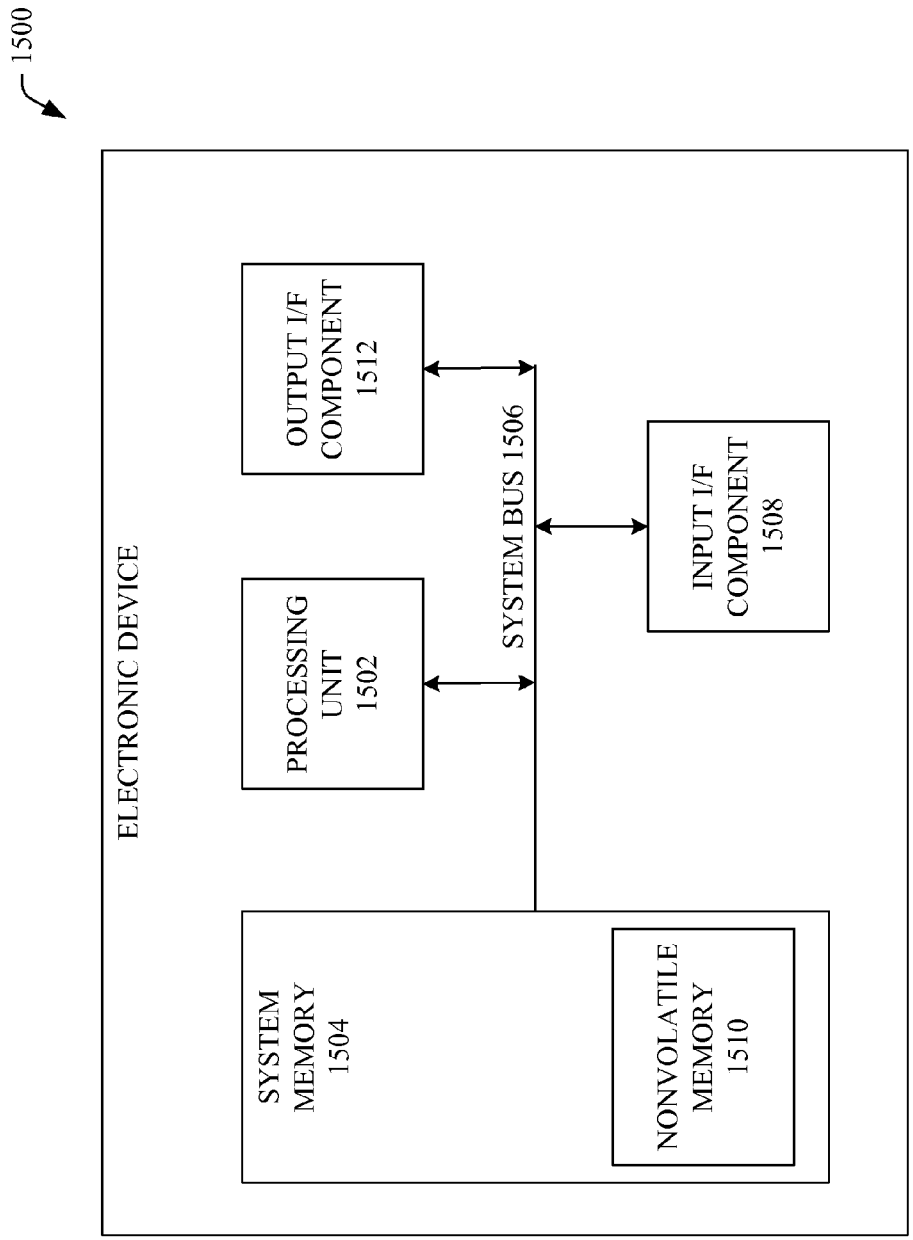
FIG. 15 is a block diagram of an exemplary electronic device that can utilize a memory device(s).

In order to provide a context for the various aspects of the disclosed subject matter, FIGS. 14 and 15 as well as the following discussion are intended to provide a brief, general description of a suitable environment in which the various aspects of the disclosed subject matter may be implemented. While the subject matter has been described above in the general context of computer-executable instructions of a computer program that runs on a computer and/or computers, those skilled in the art will recognize that the subject innovation also may be implemented in combination with other program modules. Generally, program modules include routines, programs, components, data structures, etc. that perform particular tasks and/or implement particular abstract data types. Moreover, those skilled in the art will appreciate that the inventive methods may be practiced with other computer system configurations, including single-processor or multiprocessor computer systems, mini-computing devices, mainframe computers, as well as personal computers, handheld computing devices (e.g., PDA, phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the claimed innovation can be practiced on standalone computers. In a distributed computing environment, program modules may be located in both local and remote memory storage devices.

With reference to FIG. 14, a suitable environment 1400 for implementing various aspects of the claimed subject matter includes a computer 1412. The computer 1412 includes a processing unit 1414, a system memory 1416, and a system bus 1418. The system bus 1418 couples system components including, but not limited to, the system memory 1416 to the processing unit 1414. The processing unit 1414 can be any of various available processors. Dual microprocessors and other multiprocessor architectures also can be employed as the processing unit 1414.

The system bus 1418 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1494), and Small Computer Systems Interface (SCSI).

The system memory 1416 includes volatile memory 1420 and nonvolatile memory 1422. The basic input/output system (BIOS), containing the basic routines to transfer information between elements within the computer 1412, such as during start-up, is stored in nonvolatile memory 1422. By way of illustration, and not limitation, nonvolatile memory 1422 can include ROM, PROM, EPROM, EEPROM, FeRAM, or flash memory. Volatile memory 1420 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1412 also includes removable/non-removable, volatile/ non-volatile computer storage media. FIG. 14 illustrates, for example, a disk storage 1424. Disk storage 1424 includes, but is not limited to, devices like a magnetic disk drive, floppy disk drive, tape drive, Jaz drive, Zip drive, LS-100 drive, flash memory card, or memory stick. In addition, disk storage 1424 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1424 to the system bus 1418, a removable or non-removable interface is typically used, such as interface 1426.

It is to be appreciated that FIG. 14 describes software that acts as an intermediary between users and the basic computer resources described in the suitable operating environment 1400. Such software includes an operating system 1428. Operating system 1428, which can be stored on disk storage 1424, acts to control and allocate resources of the computer system 1412. System applications 1430 take advantage of the management of resources by operating system 1428 through program modules 1432 and program data 1434 stored either in system memory 1416 or on disk storage 1424. It is to be appreciated that the disclosed subject matter can be implemented with various operating systems or combinations of operating systems.

A user enters commands or information into the computer 1412 through input device(s) 1436. Input devices 1436 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1414 through the system bus 1418 via interface port(s) 1438. Interface port(s) 1438 include, for example, a serial port, a parallel port, a game port, and a universal serial bus (USB). Output device(s) 1440 use some of the same type of ports as input device(s) 1436. Thus, for example, a USB port may be used to provide input to computer 1412, and to output information from computer 1412 to an output device 1440. Output adapter 1442 is provided to illustrate that there are some output devices 1440 like monitors, speakers, and printers, among other output devices 1440, which require special adapters. The output adapters 1442 include, by way of illustration and not limitation, video and sound cards that provide a means of connection between the output device 1440 and the system bus 1418. It should be noted that other devices and/or systems of devices provide both input and output capabilities such as remote computer(s) 1444.

Computer 1412 can operate in a networked environment using logical connections to one or more remote computers, such as remote computer(s) 1444. The remote computer(s) 1444 can be a personal computer, a server, a router, a network PC, a workstation, a microprocessor based appliance, a peer device or other common network node and the like, and typically includes many or all of the elements described relative to computer 1412. For purposes of brevity, only a memory storage device 1446 is illustrated with remote computer(s) 1444. Remote computer(s) 1444 is logically connected to computer 1412 through a network interface 1448 and then physically connected via communication connection 1450. Network interface 1448 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1450 refers to the hardware/software employed to connect the network interface 1448 to the bus 1418. While communication connection 1450 is shown for illustrative clarity inside computer 1412, it can also be external to computer 1412. The hardware/software necessary for connection to the network interface 1448 includes, for exemplary purposes only, internal and external technologies such as, modems including regular telephone grade modems, cable modems and DSL modems, ISDN adapters, and Ethernet cards.

Referring to FIG. 15, illustrated is a block diagram of an exemplary, non-limiting electronic device 1500 that can incorporate system 100, system 200, system 300, system 900, system 1000, system 1200 and/or system 1300, or a portion(s) thereof. The electronic device can include, but is not limited to, a computer, a laptop computer, network equipment (e.g. routers, access points), a media player and/or recorder (e.g., audio player and/or recorder, video player and/or recorder), a television, a smart card, a phone, a cellular phone, a smart phone, an electronic organizer, a personal digital assistant (PDA), a portable email reader, a digital camera, an electronic game, an electronic device associated with digital rights management, a Personal Computer Memory Card International Association (PCMCIA) card, a trusted platform module (TPM), a Hardware Security Module (HSM), set-top boxes, a digital video recorder, a gaming console, a navigation system or device (e.g., global position satellite (GPS) system), secure memory devices with computational capabilities, devices with tamper-resistant chips, an electronic device associated with an industrial control system, an embedded computer in a machine (e.g., an airplane, a copier, a motor vehicle, a microwave oven), and the like.

Components of the electronic device 1500 can include, but are not limited to, a processing unit 1502, a system memory 1504 (with nonvolatile memory 1510), and a system bus 1506 that can couple various system components including the system memory 1504 to the processing unit 1502 (e.g., which can be the same or similar as the host processor 902). The system bus 1506 can be any of several types of bus structures including a memory bus or memory controller, a peripheral bus, or a local bus using any of a variety of bus architectures.

Electronic device 1500 can typically include a variety of computer readable media. Computer readable media can be any available media that can be accessed by the electronic device 1500. By way of example, and not limitation, computer readable media can comprise computer storage media and communication media. Computer storage media includes volatile and non-volatile, removable and non-removable media implemented in any method or technology for storage of information such as computer readable instructions, data structures, program modules or other data. Computer storage media includes, but is not limited to, RAM, ROM, EEPROM, nonvolatile memory 1510 (e.g., flash memory) or other memory technology, CD-ROM, digital versatile disks (DVD) or other optical disk storage, magnetic cassettes, magnetic tape, magnetic disk storage or other magnetic storage devices, or any other medium which can be used to store the desired information and which can be accessed by electronic device 1500. Communication media typically embodies computer readable instructions, data structures, program modules or other data in a modulated data signal such as a carrier wave or other transport mechanism and includes any information delivery media.

The system memory 1504 includes computer storage media in the form of volatile and/or nonvolatile memory, such as nonvolatile memory 1510. A basic input/output system (BIOS), containing the basic routines that help to transfer information between elements within electronic device 1500, such as during start-up, can be stored in memory 1504. Memory 1504 typically also contains data and/or program modules that can be immediately accessible to and/or presently being operated on by processing unit 1502. By way of example, and not limitation, system memory 1504 can also include an operating system, application programs, other program modules, and program data.

The nonvolatile memory 1510 can be removable or non-removable. For example, the nonvolatile memory 1510 can be in the form of a removable memory card or a USB flash drive. In accordance with one aspect, the nonvolatile memory 1510 can include flash memory (e.g., single-bit flash memory, multi-bit flash memory), ROM, PROM, EPROM, EEPROM, or NVRAM (e.g., FeRAM), or a combination thereof, for example. Further, the flash memory can be comprised of NOR flash memory and/or NAND flash memory. It is to be appreciated that non-volatile memory 1510 can be the same or similar as, and/or can contain the same or similar functionality as, memory 102, as illustrated in FIG. 1 and other figures and described herein.

A user can enter commands and information into the electronic device 1500 through input devices (not shown) such as a keypad, microphone, tablet or touch screen although other input devices can also be utilized. These and other input devices can be connected to the processing unit 1502 through input interface component 1508 that can be connected to the system bus 1506. Other interface and bus structures, such as a parallel port, game port or a universal serial bus (USB) can also be utilized. A graphics subsystem (not shown) can also be connected to the system bus 1506. A display device (not shown) can be also connected to the system bus 1512 via an interface, such as output interface component 1512, which can in turn communicate with video memory. In addition to a display, the electronic device 1500 can also include other peripheral output devices such as speakers (not shown), which can be connected through output interface component 1512.

The aforementioned systems have been described with respect to interaction between several components. It should be appreciated that such systems and components can include those components or sub-components specified therein, some of the specified components or sub-components, and/or additional components. Sub-components could also be implemented as components communicatively coupled to other components rather than included within parent components. Further yet, one or more components and/or sub-components may be combined into a single component providing aggregate functionality. The components may also interact with one or more other components not specifically described herein for the sake of brevity, but known by those of skill in the art.

What is described above includes examples of the present specification. It is, of course, not possible to describe every conceivable combination of components or methodologies for purposes of describing the present specification, but one of ordinary skill in the art may recognize that many further combinations and permutations of the present specification are possible. Accordingly, the present specification is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A system that facilitates operation of memory, comprising:
   a memory array comprising multiple memory cells connected to respective ones of a set of bit lines;
   a controller for implementing alternating current (AC) based operations on subsets of the multiple memory cells; and
   an alternating current disturbance control component configured to pre-charge a target bit line of the set of bit lines connected to a selected memory cell of the memory and configured to pre-charge neighboring bit lines of the set of bit lines, in conjunction with the controller performing an AC operation on the selected memory cell.

2. The system of claim 1, further comprising a timer component configured to concurrently change voltage at source and drain terminals of the selected memory cell to a desired voltage associated with the AC operation.

3. The system of claim 2, wherein the timer component employs a timing sequence of voltage changes configured to compensate for capacitance or resistance effects on the selected memory cell in conjunction with concurrently changing voltage at source and drain terminals of the selected memory cell.

4. The system of claim 2, wherein the timer component is further configured to return the source and drain terminals of the selected memory cell to a pre-charge voltage in response to completion of the AC operation.

5. The system of claim 2, further comprising at least one of:
   a pre-charge timer component configured to control timing of pre-charging of the target bit line and the set of neighboring bit lines to follow application of a gate voltage related to the AC operation;
   a Vs timer component configured to maintain a timing sequence associated with changing voltage at the source terminal of the selected memory cell in conjunction with the AC operation; or
   a Vd timer component configured to maintain a timing sequence associated with changing voltage at the drain terminal of the selected memory cell in conjunction with the AC operation.

6. The system of claim 2, further comprising a Vcc generation component configured to supply a predetermined voltage to the target bit line or to the set of neighboring bit lines in conjunction with pre-charging the target bit line or pre-charging the set of neighboring bit lines, respectively.

7. The system of claim 1, wherein at least one bit line of the neighboring bit lines is immediately adjacent to the target bit line.

8. The system of claim 2, wherein at least two bit lines of the neighboring bit lines are immediately adjacent to the target bit line.

9. The system of claim 1, wherein at least one bit line of the neighboring bit lines is not immediately adjacent to the target bit line.

10. The system of claim 3, wherein at least a plurality of bit lines of the neighboring bit lines is not immediately adjacent to the target bit line.

11. A system that facilitates operation of memory, comprising:
    an alternating current (AC) disturbance control component configured to pre-charge a target bit line connected to a selected memory cell of the memory and pre-charge a set of neighboring bit lines of the memory comprising at least one bit line adjacent to the target bit line, in conjunction with an AC-based operation directed at the selected memory cell; and
    a bit line discharging component configured to discharge the target bit line following conclusion of the AC-based operation.

12. The system of claim 11, wherein the AC-based operation comprises an access operation directed at the selected memory cell.

13. The system of claim 11, wherein the AC-based operation comprises a write operation directed at the selected memory cell.

14. The system of claim 11, wherein the AC-based operation comprises a clear operation directed at the selected memory cell.

15. The system of claim 11, further comprising a timer component configured to contemporaneously update voltage levels for terminals of the selected memory cell based at least in part on a specified voltage sequence.

16. The system of claim 15, wherein the timer component is configured to update a voltage on a source terminal or a drain terminal of the selected memory cell to a predetermined voltage level based at least in part on the specified voltage sequence; and further wherein the bit line discharging component is further configured to return the voltage to a pre-charge voltage or discharge the voltage to ground following conclusion of the AC-based operation.

17. A system that facilitates operation of memory, comprising:
    an alternating current (AC) disturbance control component configured to pre-charge a target bit line connected to a selected memory cell of the memory and pre-charge a set of neighboring bit lines of the memory comprising at least one bit line adjacent to the target bit line, in conjunction with an AC-based operation targeting the selected memory cell; and
    a bit line discharging component configured to discharge the set of neighboring bit lines following conclusion of the AC-based operation.

18. The system of claim 17, further comprising a controller for implementing the AC-based operation on a subset of memory cells of the memory, wherein the AC-based operation comprises at least one of an access operation, a write operation or a clear operation.

19. The system of claim 17, further comprising a timer component configured to concurrently change voltage at source and drain terminals of the selected memory cell to a desired voltage associated with the AC operation.

20. The system of claim 19, wherein the timer component employs a timing sequence configured to compensate for capacitance or resistance effects on the selected memory associated with the concurrently changing voltage at source and drain terminals of the selected memory cell.

* * * * *